United States Patent
Lee et al.

(10) Patent No.: US 9,606,864 B2
(45) Date of Patent: Mar. 28, 2017

(54) NON-VOLATILE MEMORY DEVICE HAVING ADJUSTABLE READ VOLTAGE, MEMORY SYSTEM COMPRISING SAME, AND METHOD OF OPERATING SAME

(71) Applicant: SAMSUNG ELECTRONICS CO., LTD., Suwon-si, Gyeonggi-Do (KR)

(72) Inventors: Seung-Yeon Lee, Seoul (KR); Hee-Woong Kang, Suwon-si (KR); Jong-Nam Baek, Hwaseong-si (KR); San Song, Hwaseong-si (KR)

(73) Assignee: Samsung Electronics Co., Ltd., Suwon-si, Gyeonggi-do ( * ) Notice: Subject to any disclaimer, the term of this patent is extended or adjusted under 35 U.S.C. 154(b) by 727 days.

(21) Appl. No.: 13/947,219

(22) Filed: Jul. 22, 2013

(65) Prior Publication Data

US 2014/0101519 A1 Apr. 10, 2014

(30) Foreign Application Priority Data

Oct. 8, 2012 (KR) .......... 10-2012-0111380

(51) Int. Cl.

| | | |
|---|---|---|
| *G11C 29/00* | (2006.01) | |
| *G06F 11/10* | (2006.01) | |
| *G11C 11/56* | (2006.01) | |
| *G11C 16/26* | (2006.01) | |
| *G11C 16/34* | (2006.01) | |

(52) U.S. Cl.
CPC ...... *G06F 11/1068* (2013.01); *G11C 11/5642* (2013.01); *G11C 16/26* (2013.01); *G11C 16/3431* (2013.01)

(58) Field of Classification Search
CPC ............ G06F 11/1068; G06F 11/1048; G11C 11/5642; G11C 16/26; G11C 16/3431; G11C 13/004; G11C 29/028; G11C 16/0483; G11C 29/021
See application file for complete search history.

(56) References Cited

U.S. PATENT DOCUMENTS

| | | | |
|---|---|---|---|
| 7,609,557 B2 | 10/2009 | Aritome | |
| 8,072,805 B2 | 12/2011 | Chou et al. | |
| 8,125,825 B2 | 2/2012 | Seol | |
| 2004/0136236 A1 | 7/2004 | Cohen | |
| 2008/0205136 A1* | 8/2008 | Wang | G06F 11/1072 365/185.03 |
| 2008/0244339 A1 | 10/2008 | Kong et al. | |
| 2010/0199138 A1* | 8/2010 | Rho | G11C 16/26 714/746 |

(Continued)

*Primary Examiner* — Albert Decady
*Assistant Examiner* — Enamul M Kabir
(74) *Attorney, Agent, or Firm* — Volentine & Whitt, PLLC

(57) ABSTRACT

A nonvolatile memory device includes a memory cell array including a selected page including multiple error correction code (ECC) units, and a voltage generation unit configured to generate a read voltage to read data from the selected page. Read voltage levels are set individually for the respective ECC units according to data detection results for each of the ECC units. During a read retry section performed with respect to selected ECC units of the selected page for which read errors have been detected, a re-read operation of the selected ECC units is performed according to the respective read voltage levels set for the selected ECC units.

20 Claims, 21 Drawing Sheets

(56) References Cited

U.S. PATENT DOCUMENTS

| | | | |
|---|---|---|---|
| 2010/0302850 A1* | 12/2010 | Kim | G06F 11/1048 365/185.09 |
| 2011/0044101 A1* | 2/2011 | Chou | G11C 11/5642 365/185.03 |
| 2011/0107161 A1 | 5/2011 | Eguchi et al. | |
| 2011/0182119 A1* | 7/2011 | Strasser | G11C 16/28 365/185.03 |
| 2011/0225473 A1 | 9/2011 | Mokhlesi | |
| 2011/0231740 A1* | 9/2011 | Lasser | G06F 11/1068 714/773 |
| 2012/0240011 A1* | 9/2012 | Helm | G11C 16/28 714/773 |
| 2013/0073924 A1* | 3/2013 | D'Abreu | G06F 11/1048 714/763 |

\* cited by examiner

NON-VOLATILE MEMORY DEVICE HAVING ADJUSTABLE READ VOLTAGE, MEMORY SYSTEM COMPRISING SAME, AND METHOD OF OPERATING SAME

CROSS-REFERENCE TO RELATED APPLICATIONS

This application claims priority under 35 U.S.C. §119 to Korean Patent Application No. 10-2012-0111380 filed on Oct. 8, 2012, the subject matter of which is hereby incorporated by reference.

BACKGROUND OF THE INVENTION

The inventive concept relates generally to memory technologies. More particularly, certain embodiments of the inventive concept relate to nonvolatile memory devices, memory systems comprising nonvolatile memory devices, and methods of operating nonvolatile memory devices.

Nonvolatile memory devices such as flash memories are used to store information in a wide variety of electronic devices and systems. As examples, nonvolatile memories can be found in many portable electronic devices, such as mobile phones, digital cameras, personal digital assistants (PDAs), and portable computers, to name but a few.

There is a general demand for nonvolatile memory devices having reduced size and increased operating speed. However, these desired improvements often come with tradeoffs. For instance, device miniaturization often decreases lifespan and increases the likelihood of errors. Moreover, although an error correction code (ECC) circuit may be used to correct error bits, the number of error bits that may be corrected by an ECC circuit is limited. Accordingly, there is a general need for new approaches to address these and other shortcomings of conventional nonvolatile memory devices.

SUMMARY OF THE INVENTION

In one embodiment of the inventive concept, a nonvolatile memory device comprises a memory cell array comprising a selected page comprising multiple ECC units, and a voltage generation unit configured to generate a read voltage to read data from the selected page. Read voltage levels are set individually for the respective ECC units according to data detection results for each of the ECC units. During a read retry section performed with respect to selected ECC units of the selected page for which read errors have been detected, a re-read operation of the selected ECC units is performed according to the respective read voltage levels set for the selected ECC units.

In another embodiment of the inventive concept, a method of operating a nonvolatile memory device comprises setting read voltage levels corresponding to multiple ECC units based on data detection results for the respective ECC units, performing error detection on data read from first to n-th ECC units (n>1) connected to the same word line using a normal read voltage, according to the error detection results, selecting read voltages corresponding to the respective ECC units with respect to one or more ECC units in which read errors have occurred, and re-reading data for the ECC units using the read voltages selected with respect to the respective ECC units. Units of information related to the read voltage levels that are set to correspond to the respective ECC units are stored in the nonvolatile memory device.

In another embodiment of the inventive concept, a memory system comprises a memory controller comprising a voltage control unit and an ECC circuit, and a nonvolatile memory device comprising a memory cell array comprising a selected page comprising multiple ECC units and a voltage generation unit configured to generate a read voltage to read data from the selected page. The memory controller is configured to control the nonvolatile memory device to detect data stored in each of the respective ECC units upon powering up of the memory system, is further configured to set read voltage levels individually for the respective ECC units according to the detected data, and still further configured to control the nonvolatile memory device during a read retry section performed with respect to selected ECC units of the selected page for which read errors have been detected such that a re-read operation of the selected ECC units is performed according to the respective read voltage levels set for the selected ECC units.

These and other embodiments of the inventive concept can potentially improve the reliability of nonvolatile memory devices by allowing read voltages to be adjusted according to the individual circumstances of different ECC units.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

The terminology used herein is for the purpose of describing embodiments only and is not intended to be limiting of the inventive concept. As used herein, terms in the singular form, e.g., "a," "an" and "the", are intended to encompass corresponding concepts in the plural form as well, unless the context clearly indicates otherwise. Terms such as "comprises," "includes," "comprising," "including," etc., where used in this specification, indicate the presence of stated features but do not preclude the presence or addition of one or more other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," where preceding a list of elements, modify the entire list of elements and do not modify the individual elements of the list.

Figure 1:
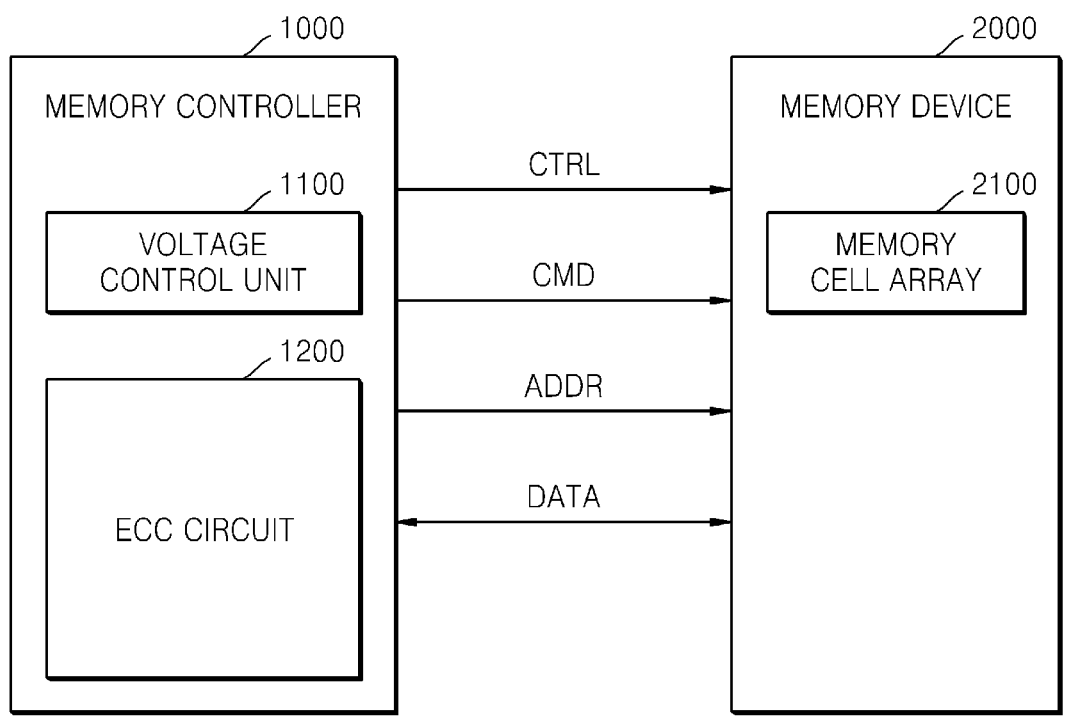
FIG. 1 is a block diagram of a memory system according to an embodiment of the inventive concept.

FIG. 1 is a block diagram of a memory system 100 according to an embodiment of the inventive concept.

Referring to FIG. 1, memory system 100 comprises a memory controller 1000 and a nonvolatile memory device 2000. Memory controller 1000 controls operation of nonvolatile memory device 2000. For example, memory controller 1000 may control program, read, and erase operations of nonvolatile memory device 2000 by providing an address ADDR, a command CMD, and a control signal CTRL to nonvolatile memory device 2000.

Nonvolatile memory device 2000 comprises a memory cell array 2100 comprising multiple memory cells disposed near intersections of corresponding word lines and bit lines. Memory cell array 2100 comprises nonvolatile memory cells, e.g., in a NAND flash memory cell array or a NOR flash memory cell array. In the description that follows, it will be assumed that memory cell array 2100 comprises a flash memory cell array, although the inventive concept is not limited to this example, and memory cell array 2100 could alternatively include memory cells of different types, such as resistive memory cells including a resistive random-access memory (RRAM), a phase change RAM (PRAM), or a magnetic RAM (MRAM).

Memory controller 1000 comprises a voltage control unit 1100 and an ECC circuit 1200. Voltage control unit 1100 performs operations for controlling at least one voltage level used in nonvolatile memory device 2000, and control signal CTRL provided from memory controller 1000 to nonvolatile memory device 2000 comprises a voltage control signal for controlling a voltage level. For example, voltage control unit 1100 may control the level of a read voltage for reading data from memory cell array 2100. For convenience, it will be assumed that control signal CTRL is a read voltage control signal.

ECC circuit 1200 performs operations related to error correction, and may perform, for example, an ECC encoding process and an ECC decoding process by using an algorithm such as a Reed-Solomon (RS) code, a hamming code, or a cyclic redundancy code (CRC). The ECC encoding process comprises an operation for generating parity bits based on data to be programmed, and the ECC decoding process comprises an operation for detecting error bits from data read from memory cell array 2100 and an operation for correcting the detected error bits. For example, ECC circuit 1200 may detect the error bits by comparing parities generated and stored when programming data with the parity bits generated when reading data and may correct the error bits by executing a predetermined logical operation (e.g., exclusive OR (XOR)) with respect to the detected error bits.

ECC circuit 1200 may be set to have a predetermined error correction factor, and it may be set to perform error correction with respect to units of data having a predetermined size. In the description that follows, the term "ECC unit" denotes a unit of data of predetermined size on which the error correction is performed. As will be apparent from the following description, the size of an ECC unit may be modified under different circumstances. For instance, the size may be increased as the error correction factor increases.

Voltage control unit 1100 controls the level of a read voltage for reading data stored in memory cell array 2100 based on data DATA received from nonvolatile memory device 2000. Where the memory cell in memory cell array 2100 is a single level cell (SLC), a voltage level control operation with respect to one read voltage may be performed. On the other hand, where the memory cell in memory cell array 2100 is a multi-level cell (MLC) storing 2 bits of data for each cell, a triple level cell (TLC) storing 3 bits of data, or a cell storing a greater number of bits of data, a voltage level control operation with respect to two or more read voltages may be performed. In other words, where read voltage control signal CTRL for controlling a read voltage is provided to nonvolatile memory device 2000, even though threshold voltages of the memory cells may be changed due to external stimulation and/or wearing, or the like, the voltage level of the read voltage may be controlled on the basis of the changed threshold voltage, and thus a raw bit error rate (RBER) may be improved.

As process miniaturization of nonvolatile memory device 2000 progresses, the possibility of generating read errors during data reading is increased. Where a read error is generated, memory controller 1000 controls nonvolatile memory device 2000 to execute a read retry section. In the read retry section, a modified read voltage is provided to memory cell array 2100, a re-read operation is performed to re-read data, and error detection and correction operations are performed on the re-read data. Generation of errors may be reduced by causing data to be read at an appropriate read voltage level.

Figure 2:
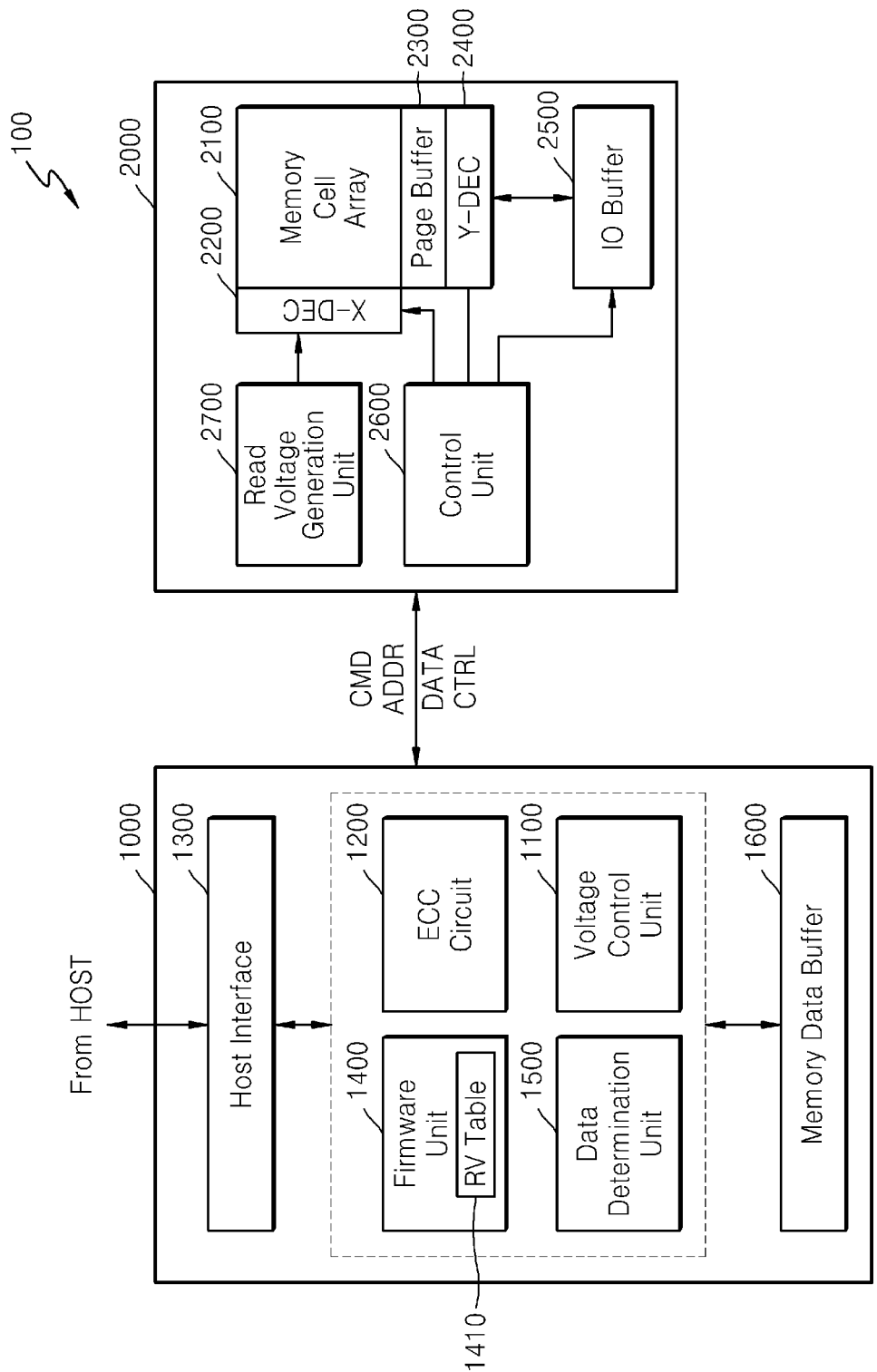
FIG. 2 is a block diagram of a more detailed example of the memory system of FIG. 1.

FIG. 2 is a block diagram of a more detailed example of memory system 100 of FIG. 1.

Referring to FIG. 2, memory system 100 comprises memory controller 1000 and nonvolatile memory device 2000. Memory controller 1000 comprises a host interface 1300, control logic, and memory data buffer 1600. The control logic comprises various components for controlling a memory operation of nonvolatile memory device 2000, and the control logic comprises, for example, a firmware unit 1400, an ECC circuit 1200, a data determination unit 1500, and a voltage control unit 1100. In addition, nonvolatile memory device 2000 comprises a memory cell array 2100, a row decoder 2200, a page buffer 2300, a column decoder 2400, an input/output buffer 2500, a control unit 2600, and a read voltage generation unit 2700.

Memory controller 1000 generates various signals for controlling program, read, and erase operations with respect to nonvolatile memory device 2000 in response to a request from a host HOST. For example, command CMD and address ADDR may be provided to nonvolatile memory device 2000 for the memory operation, data DATA may be provided to nonvolatile memory device 2000 during the program operation, and data DATA read from nonvolatile memory device 2000 may be received during the read operation.

Host interface 1300 interfaces with a host to receive a request for the memory operation from the host. For example, host interface 1300 receives various requests such as program, read, erase, movement, and recovery operations of data from the host and generates various internal signals for the memory operation with respect to nonvolatile memory device 2000 in response to the various requests. Firmware unit 1400, which comprises software including a flash translation layer (FTL), may be configured as a memory such as a random-access memory (RAM) or a read-only memory (ROM) storing the FTL. Firmware unit 1400 controls operations of memory controller 1000 in response to various internal signals from host interface 1300.

ECC circuit 1200 typically performs the above-described ECC encoding and ECC decoding processes, generates error detection results with respect to the data that is read from memory cell array 2100, and performs error correction operations with respect to the read data. Data determination unit 1500 performs a determination operation with respect to the data that is read from memory cell array 2100, and determines a value of the read data or determines whether data has an error through a process operation (e.g., operation) for the value of the read data. As described above, voltage control unit 1100 may perform operations for controlling the read voltage level for data reading of nonvolatile memory device 2000. Although the above-described voltage control unit 1100 and data determination unit 1500 are illustrated as different functional blocks, voltage control unit 1100 and data determination unit 1500 may be illustrated as the same functional block in terms of controlling of the read voltage level of nonvolatile memory device 2000 according to data determination results.

Meanwhile, memory cell array 2100 comprises one or more memory blocks, and the memory block may be defined as a data erase unit of nonvolatile memory device 2000. In addition, each memory block comprises multiple pages, and each page includes multiple memory cells connected to the same word line. Furthermore, each page may be partitioned into multiple areas, which can be ECC units. In other words, each page can comprise multiple ECC units connected to the same word line.

Nonvolatile memory device 2000 performs the memory operation in response to various signals including command CMD, address ADDR, and data DATA from memory controller 1000, and various operations in nonvolatile memory device 2000 are wholly controlled by control unit 2600. Row decoder 2200 is connected to memory cell array 2100 via the word line, and the word line selected in response to a row address and non-selected word lines are driven with the respective word line voltages corresponding thereto. During a read operation, the word line voltage may correspond to a read voltage, or alternatively, the word line voltage provided to the selected word line may correspond to the read voltage.

Column decoder 2400 is operated in response to a column address, and column decoder 2400 selects data latched to page buffer 2300 and transmits the selected data to input/output buffer 2500 or provides data stored in input/output buffer 2500 to page buffer 2300. Input/output buffer 2500 stores data DATA provided from memory controller 1000 or transmits data DATA read from memory cell array 2100 to memory controller 1000. Meanwhile, a read voltage generation unit 2700 generates a word line voltage for various memory operations, such as program, read, and erase operations, and provides the word line voltage to row decoder 2200.

In some embodiments, where an error occurs in a read operation and a read retry operation is performed, the read retry operation is performed in the above-described area units. For example, any one page is read using a first read voltage, and error detection and correction operations are performed on the read data. Where errors occur in the read data (or where uncorrectable errors occur), the data is re-read by re-reading the page using at least one read voltage having a level different from the first read voltage. The first read voltage may be a voltage for distinguishing two of multiple threshold voltage distributions. For example, in a multi-level cell storing 2 bits of data in each memory cell, first to third read voltages may be used to read data.

Such a read operation using the first read voltage may be referred to as a normal read operation. Where errors occur in the normal read operation, the read operation performed in the read retry section may be referred to as a re-read operation. In the re-read operation, each of reading processes in area units may refer to a re-read operation for each area.

The read voltage used during the re-read operation may have one or more voltage levels. For example, an appropriate read voltage may be extracted with respect to each of multiple areas in the page, and the read voltages set in the areas may have different levels. After the process of extracting the read voltage level, the read voltage level minimizing occurrence of errors is set with respect to each area, and the read voltage of the extracted level is applied to each area, and accordingly, a read operation and an error detection operation are performed. Thus, even though errors occur in one or more areas among the areas in a page, because the re-read operation for each area is performed using the read voltage set to correspond to each area, read errors occurring in each area may be reduced or prevented.

In the threshold voltage distribution, a minimum error reading method is used to search for a valley between two threshold voltage distributions. This method is performed by reading data of memory cells using different values of a read voltage and identifying a level that corresponds to a valley. For instance, the method may be performed by reading memory cells using a read voltage that is increased and/or decreased level relative to a reference voltage, and counting a number of cells having different states, e.g., by counting a number of cells storing data "0" and "1" for each level of the read voltage. Where multiple areas are read through one read operation, a number of cells may be counted for each area, the minimum error read level for each area may be extracted by repeatedly performing the counting around the valley between the distributions.

As errors occur in data read through normal read operations for a page, an algorithm for addressing the errors is performed by memory controller 1000. Memory controller 1000 provides read voltage control signal CTRL for changing the read voltage to nonvolatile memory device 2000, and thus a voltage level for reducing occurrence of errors is selected for each area of the page, and a re-read operation of data using the selected read voltage is performed. For example, where the areas are defined for each ECC unit, the read voltage levels may be selected for each ECC unit. Data of ECC units read by the read voltage of the selected level is provided to ECC circuit 1200 of memory controller 1000, and where the read voltage of an appropriate level is selected, data (or error-correctable data) in which an error does not occur may be obtained.

In the example of FIG. 2, the read voltage levels are set with respect to area units of the pages, and set information is stored in memory controller 1000. For example, after the read voltage levels are set in area units, the corresponding information may be stored in nonvolatile memory device 2000 in a nonvolatile manner and may be provided to memory controller 1000 during every system drive. The information provided from nonvolatile memory device 2000 may be stored in, for example, a read voltage table 1410 of firmware unit 1400. Alternatively, read voltage table 1410 is disposed outside of firmware unit 1400 to be managed by firmware unit 1400.

Alternatively, during driving of memory system 100, the read voltage level is set in each area of memory cell array 2100 under the control of memory controller 1000, and information related to the set read voltage level is stored in a table in memory controller 1000. When setting the read voltage level, data may be read while changing the read voltage level for each area, and the read voltage level having a least number of errors may be set in the read data. Data determination unit 1500 performs a determination operation on the read data while changing the read voltage level. For example, data determination unit 1500 may determine states of the read data and determine whether or not errors occur based on processing of the data, and the level of a desired read voltage (e.g., an optimal read voltage or a selected read voltage) may be determined for each area according to the determination results. The determination operation may be performed in units of areas of one page, and thus the read voltage having different levels in area units may be selected.

Figure 3:
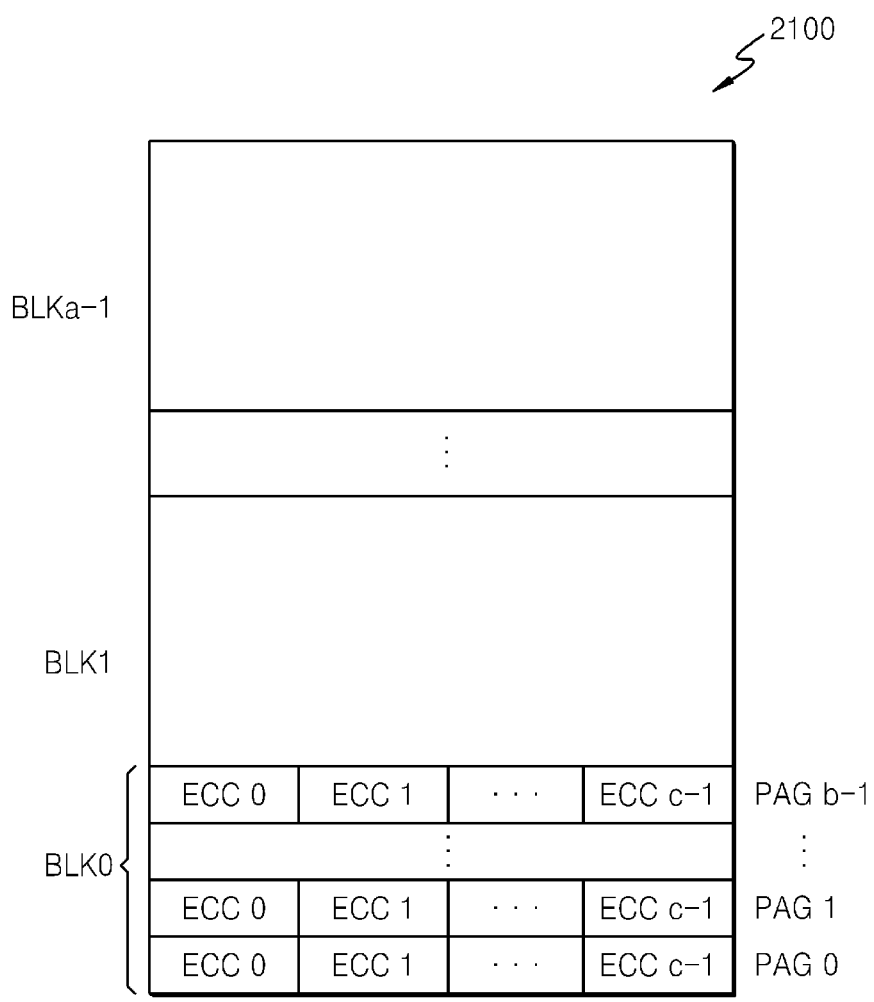
FIG. 3 illustrates an example of a memory cell array in a nonvolatile memory device of FIG. 2.

FIG. 3 illustrates an example of memory cell array 2100 in nonvolatile memory device 2000 of FIG. 2.

Referring to FIG. 3, memory cell array 2100 may be a flash memory cell array. Here, memory cell array 2100 comprises a-blocks BLK0 to BLKa−1 ('a' is an integer equal to or greater than 2), each of blocks BLK0 to BLKa−1 comprises b-pages PAG0 to PAGb−1 ('b' is an integer equal to or greater than 2), and each of pages PAG0 to PAGb−1 comprises c-ECC units ECC0 to ECCc−1 ('c' is an integer equal to or greater than 2). For convenience, although pages PAG0 to PAGb−1 and ECC units ECC0 to ECCc−1 are illustrated only with respect to block BLK0 in FIG. 3, remaining blocks BLK1 to BLKa−1 may have the same structure as block BLK0.

Figure 4:
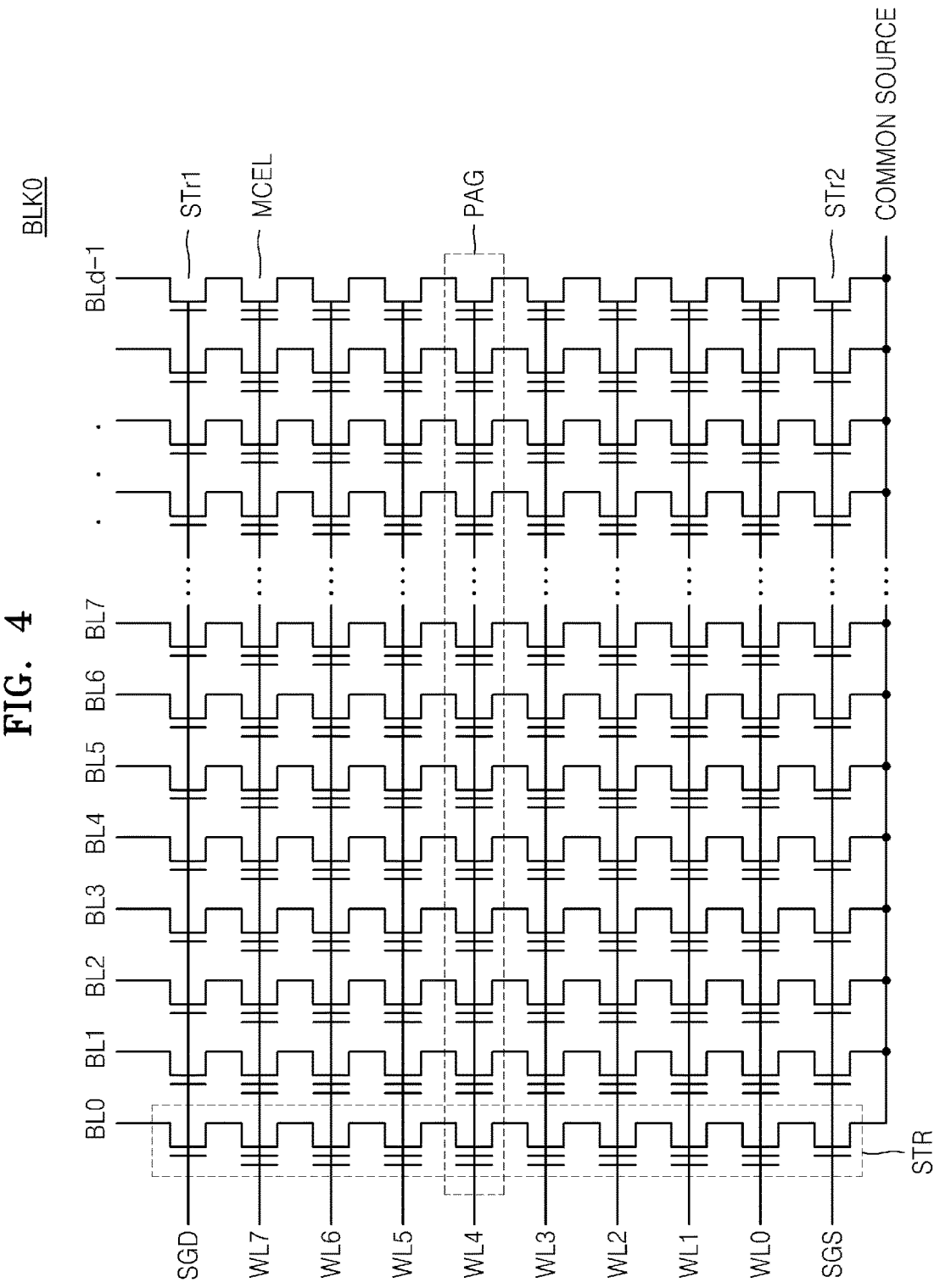
FIG. 4 is a circuit diagram illustrating an example of a memory block in the memory cell array of FIG. 3.

FIG. 4 is a circuit diagram illustrating an example of memory block BLK0 in memory cell array 2100 of FIG. 3.

Referring to FIG. 4, memory cell array 2100 is a memory cell array of a NAND flash memory. Blocks BLK0 to BLKa−1 of FIG. 3 may be configured as illustrated in FIG. 4, for instance. In FIG. 4, blocks BLK0 to BLKa−1 each comprise d-strings STR ('d' is an integer equal to or greater than 2) in which eight memory cells MCEL are connected to each other in series in a direction of bit lines BL0 to BLd−1. Each string STR comprises a drain selection transistor Str1 and a source selection transistor Str2 that are connected to both ends of each of memory cells MCEL connected to each other in series.

The NAND flash memory device performs an erase operation in units of blocks and performs a program operation in units of pages PAG corresponding to respective word lines WL0 to WL7. FIG. 4 illustrates an example in which eight pages PAG corresponding to eight word lines WL0 to WL7 are in one block. However, blocks BLK0 to BLKa−1 of memory cell array 2100 may include a different numbers of memory cells and pages from the number of memory cells MCEL and pages PAG of FIG. 4. In addition, nonvolatile memory device 2000 of FIGS. 1 and 2 may include multiple memory cell arrays that have the same structure and perform the same operation as memory cell array 2100 described above.

Figure 5:
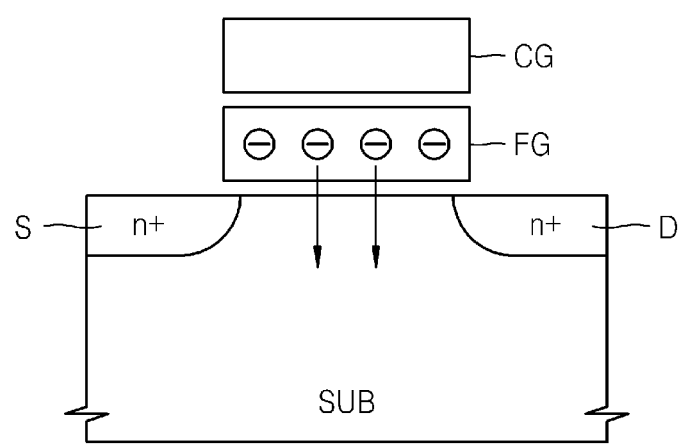
FIG. 5 is a cross-sectional view illustrating an example of a memory cell in the memory block of FIG. 4.

FIG. 5 is a cross-sectional view illustrating an example of memory cell MCEL in memory block BLK0 of FIG. 4.

Referring to FIG. 5, a source S and a drain D are formed on a substrate SUB, and a channel area is formed between source S and drain D. A floating gate FG is formed above the channel area, and an insulating layer such as a tunneling insulating layer is disposed between the channel area and floating gate FG. A control gate CG is formed above floating gate FG, and an insulating layer such as a blocking insulating layer is disposed between floating gate FG and control gate CG. Voltages necessary for program, erase, and read operations for memory cell MCEL are applied to substrate SUB, source S, drain D, and control gate CG.

In the flash memory device, data stored in memory cell MCEL is read by distinguishing a threshold voltage Vth of memory cell MCEL. Here, threshold voltage Vth of memory cell MCEL is determined by an amount of electrons stored in floating gate FG. As the amount of electrons stored in floating gate FG increases, threshold voltage Vth of memory cell MCEL is increased.

Electrons stored in floating gate FG of memory cell MCEL may leak in a direction of an arrow due to various factors, which can change threshold voltage Vth. For example, the electrons stored in floating gate FG may leak due to wearing of memory cell MCEL. Specifically, if an access operation such as a program, erase, or read operation for memory cell MCEL is repeated, the insulating layer between the channel area and floating gate FG may be worn, and thus the electrons stored in floating gate FG may leak. Alternatively, the electrons stored in floating gate FG may leak due to high-temperature stress or a temperature difference during the program/read operation.

FIGS. 6A to 6D are graphs illustrating examples of threshold voltage distributions for different types of memory cells and examples of variation in the threshold voltage distributions. The threshold voltage distributions of FIGS. 6A to 6D may be, for instance, threshold voltage distributions of memory cells in one ECC unit.

Figure 6A:
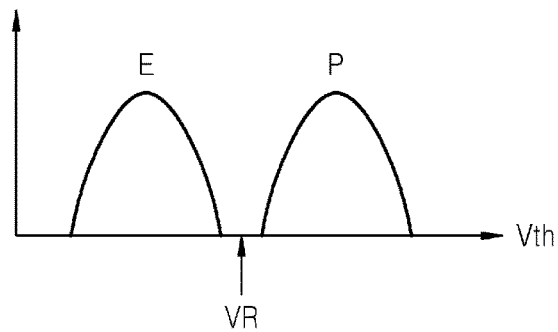
FIGS. 6A, 6B, 6C, and 6D are graphs illustrating examples of threshold voltage distributions for different types of memory cells and examples of variation in the threshold voltage distributions.

FIG. 6A is a graph illustrating a threshold voltage distribution of nonvolatile memory device 2000 where memory cell MCEL is a single level cell. In FIG. 6A and other figures, a horizontal axis represents threshold voltage Vth, and a vertical axis represents a number of memory cells. The number of the memory cells corresponding to the threshold voltage distribution of FIG. 6A may be a number of memory cells in the ECC unit.

A single level cell that is programmed with 1-bit, the memory cell may have one of an erase state E and a program state P. Here, a read voltage VR has a voltage level between a distribution of the memory cell having erase state E and a distribution of the memory cell having program state P.

For example, if read voltage VR is applied to control gate CG of the memory cell, the memory cell of erase state E is turned on, while the memory cell of program state P is turned off. If the memory cell is turned on, current flows through the memory cell, while if the memory cell is turned off, current does not flow through the memory cell. Accordingly, data stored in the memory cell may be distinguished according to whether the memory cell is turned on or off.

In some embodiments, if the memory cell is turned on by applying read voltage VR, data of a first value (e.g., data 1) is stored, and if the memory cell is turned off, data of a second value (e.g., data 0) is stored. However, the inventive concept is not limited thereto, and in another embodiment of the inventive concept, it is distinguished that if the memory cell is turned on by applying read voltage VR, data 0 is stored, while if the memory cell is turned off, data 1 is stored. As such, allocation of a logic level of data may vary according to embodiments of the inventive concept.

Figure 6B:
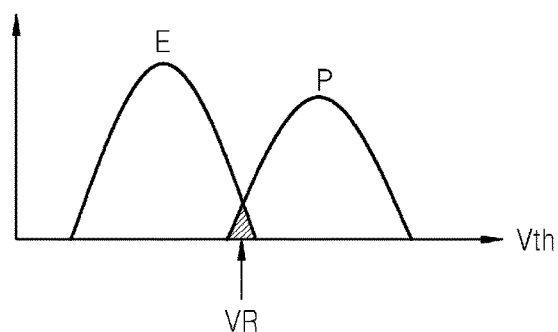

FIG. 6B is a graph illustrating an example where the threshold voltage of the memory cell is changed in the graph of FIG. 6A.

Referring to FIG. 6B, the memory cells that are programmed as erase state E and program state P may have modified distributions as illustrated in FIG. 6B due to external stimulation and/or wearing. In FIG. 6B, read errors may occur in the memory cells belonging to a section illustrated by hatching lines, and thus reliability of nonvolatile memory device 2000 may be decreased.

For example, where a read operation for nonvolatile memory device 2000 is performed using read voltage VR, although the memory cells belonging to a section illustrated with hatching lines are programmed as program state P, the memory cells may be determined as erase state E due to a decrease in threshold voltage Vth. Thus, errors occur in the read operation, thereby decreasing reliability of nonvolatile memory device 2000.

The threshold voltage of the memory cell of FIG. 6B may vary between area units. For example, if it is assumed that a variation in the threshold voltage distribution of FIG. 6B corresponds to a first area, where a read voltage level for the first area is set, the read voltage level may be set to a level at which occurrence of errors is minimized in the threshold voltage distribution of FIG. 6B. On the other hand, in a second area, a threshold voltage distribution may vary in a different fashion from the threshold voltage distribution of FIG. 6B. Accordingly, a read voltage level set in the second area may have a value different from that of the read voltage level set in the first area.

Figure 6C:
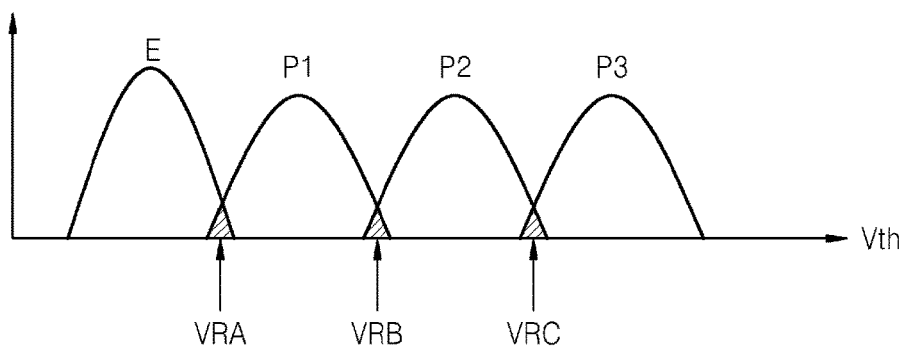

FIG. 6C is a graph illustrating an example of variation in threshold voltage distributions where the memory cell is a 2-bit multi-level cell.

Referring to FIG. 6C, where the memory cell is a 2-bit multi-level cell programmed as 2-bit, the memory cell may have one of erase state E, a first program state P1, a second program state P2, and a third program state P3. In a multi-level cell, intervals between distributions of threshold voltage Vth tend to be relatively narrow, so the possibility of generating data errors may be increased due to a small variation in threshold voltage Vth as compared with the case of the single level cell.

A first read voltage VRA has a voltage level between the distribution of the memory cell having erase state E and the distribution of the memory cell having first program state P1. A second read voltage VRB has a voltage level between the distribution of the memory cell having first program state P1 and the distribution of the memory cell having second program state P2. A third read voltage VRC has a voltage level between the distribution of the memory cell having second program state P2 and the distribution of the memory cell having third program state P3.

The memory cells that are respectively programmed as erase state E and the first to third program states P1 to P3 may have modified distributions as illustrated in FIG. 6C due to external stimulation and/or wearing. In FIG. 6C, read errors may occur in the memory cells belonging to a section illustrated by hatching lines, and thus reliability of nonvolatile memory device 2000 may be decreased.

Figure 6D:
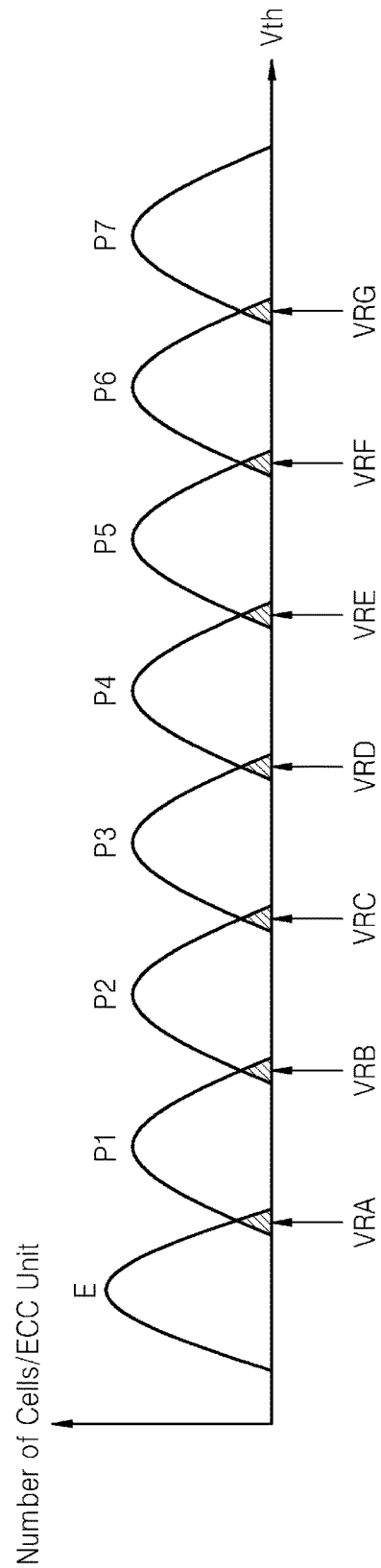

FIG. 6D is a graph illustrating an example of a variation in the threshold voltage distribution of the memory cells where the memory cell is a triple level cell.

Referring to FIG. 6D, where the memory cell is programmed with 3-bits, it may have one of erase state E, a first program state P1, a second program state P2, a third program state P3, a fourth program state P4, a fifth program state P5, a sixth program state P6, and a seventh program state P7.

First read voltage VRA has a voltage level between the distribution of the memory cell having erase state E and the distribution of the memory cell having first program state P1. Second read voltage VRB has a voltage level between the distribution of the memory cell having first program state P1 and the distribution of the memory cell having second program state P2. Third read voltage VRC has a voltage level between the distribution of the memory cell having second program state P2 and the distribution of the memory cell having third program state P3. A fourth read voltage VRD has a voltage level between the distribution of the memory cell having third program state P3 and the distribution of the memory cell having fourth program state P4. A fifth read voltage VRE has a voltage level between the distribution of the memory cell having fourth program state P4 and the distribution of the memory cell having fifth program state P5. A sixth read voltage VRF has a voltage level between the distribution of the memory cell having fifth program state P5 and the distribution of the memory cell having sixth program state P6. A seventh read voltage VRG has a voltage level between the distribution of the memory cell having sixth program state P6 and the distribution of the memory cell having seventh program state P7.

The memory cells that are respectively programmed as erase state E and first to seventh program states P1 to P7 may have modified distributions as illustrated in FIG. 6D due to external stimulation and/or wearing. In FIG. 6D, read errors may occur in memory cells belonging to a section illustrated by hatching lines, and thus reliability of nonvolatile memory device 2000 may be decreased.

Where data is read from nonvolatile memory device 2000, an error rate may vary depending on voltage levels of the read voltage, and an optimal voltage level of the read voltage may be determined according to distribution shapes of the memory cells. In addition, error detection and correction units for the read data may be defined for each ECC unit, the threshold voltage distributions of the memory cells may be differently determined for each ECC unit. To normally use the read data, the errors occurring in the read data are required to be correctable, an optimal read voltage level is set in each of the ECC units, and the read retry operation is performed using the optimal read voltage level, thereby improving the possibility of correcting the errors.

Although FIGS. 6A to 6D illustrate examples where the memory cell is a single level cell, a multi-level cell, or a triple level, the inventive concept is not limited thereto, and the memory cell of FIG. 5 may be a cell programmed with 4-bits or more. In addition, nonvolatile memory device 2000 of FIGS. 1 and 2 may include memory cells programmed with different numbers of bits.

Figure 7:
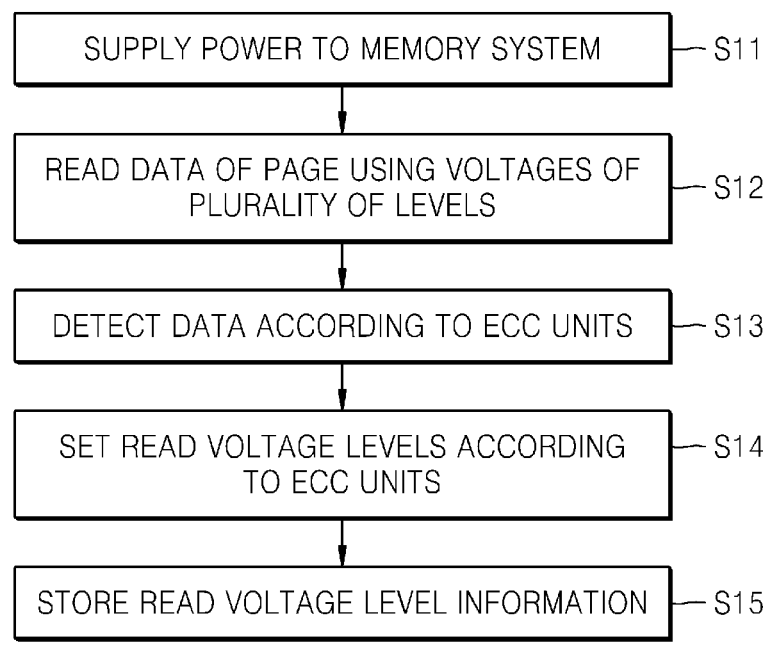
FIG. 7 is a flowchart illustrating method of operating a memory system according to an embodiment of the inventive concept.

FIG. 7 is a flowchart illustrating a method of operating a memory system according to an embodiment of the inventive concept. FIG. 7 illustrates an example of setting a read voltage level in each of multiple areas of a memory cell array, and it is assumed that the areas correspond to ECC units for error detection and correction operations.

As power is supplied to the memory system, a nonvolatile memory device and a memory controller are driven (S11). The memory controller performs a read operation for the memory cell array in the nonvolatile memory device (S12), and the read operation is performed in read units (e.g., page units) of the memory cell array. Data read in page units is stored in a predetermined buffer in the nonvolatile memory device, for example, a page buffer. In addition, data of the page may be read by using voltages of multiple levels as read voltages.

Thereafter, a detection operation for the read data is performed, for example, for each ECC unit (S13). The data detection operation may be performed in various ways. For example, a value of data 1 or data 0 may be determined from the read data. In addition, because the data detection operation may be performed for each ECC unit, a value of data 1 or data 0 may be determined for each ECC unit. Furthermore, the data detection operation may include an operation of determining whether errors occur on the basis of a processing operation of the data. In addition, where the data of the page is read using read voltages of n-levels (e.g., read voltages of first to n-th levels), the data detection operation for each ECC unit may be performed in each case.

Numbers of errors occurring in the respective ECC units may be different from each other according to the detection results. For example, where the read operation is performed using the read voltage of the first level, an error may not occur or correctable errors may occur in the first ECC unit, while errors (or uncorrectable errors) may occur in the second ECC unit. In this case, the read voltage of the first level may be set as an optimal read voltage in the first ECC unit, while it is necessary for the read operation to be performed with a different read voltage (e.g., read voltage of second level) in the second ECC unit.

The data read and detection operations using the read voltages of multiple levels are repeated, and thus optimal read voltage levels may be detected with respect to the respective ECC units. Where a-ECC units are in one page, an optimal read voltage level may be detected with respect to each of the a-ECC units. Preferably, where data is read with the read voltage of the level corresponding to each of the a-ECC units, an error may not occur or only correctable errors may occur in the read data.

By the above-described operation, levels of the read voltages are set for each ECC unit with respect to multiple ECC units belonging to any one page (S14). In other words, at least two read voltages having different levels with respect to one page may be set. If setting of the read voltage levels with respect to one page is completed, setting of the read voltage levels with respect to the next page is performed, and the above-described setting operation may be performed on all of the pages in the memory cell array. Information regarding the read voltage level set as described above may be stored as a table in the memory system, for example, in a predetermined storage unit in the memory controller (S15).

Meanwhile, the nonvolatile memory cell in the memory cell array may be a multi-level cell storing 2 bits of data for each data, a triple level cell storing 3 bits of data for each cell, or a cell storing a greater number of bits of data. In this case, in order to read multiple bits of data, multiple read voltages may be used for each page. For example, in an example where the nonvolatile memory cell is a multi-level cell, the nonvolatile memory cell may be programmed as any one threshold voltage from among four threshold voltages according to program states, and first to third read operations using three read voltages are necessary to read the multi-level cell. In other words, the first read operation using a first read voltage for distinguishing between an erase state and a first program state, the second read operation using a second read voltage for distinguishing between the first program state and a second program state, and the third read operation using a third read voltage for distinguishing between the second program state and a third program state are necessary.

An operation of setting the above-described read voltage levels may be performed with respect to levels for distinguishing the program states. For example, where errors occur in at least one ECC unit during the first read operation using the first read voltage, a read voltage of multiple levels to be used in a read retry section for this may be set. In addition, where errors occur in at least one ECC unit during the second read operation using the second read voltage, a read voltage of multiple levels to be used in a read retry section for this may be set. Similarly, where errors occur in at least one ECC unit during the third read operation using the third read voltage, a read voltage of multiple levels to be used in a read retry section for this may be set.

In addition, the above-described read voltage level setting operation and read voltage level information storing operations may be performed during an initial operation when driving the memory system before performing a memory operation (e.g., normal memory operation) according to a user's request. For example, the above-described operations may be performed at the same time where power is supplied to the memory system, and accordingly, the read voltage level information may be stored in the memory system in a volatile or nonvolatile fashion.

Figure 8:
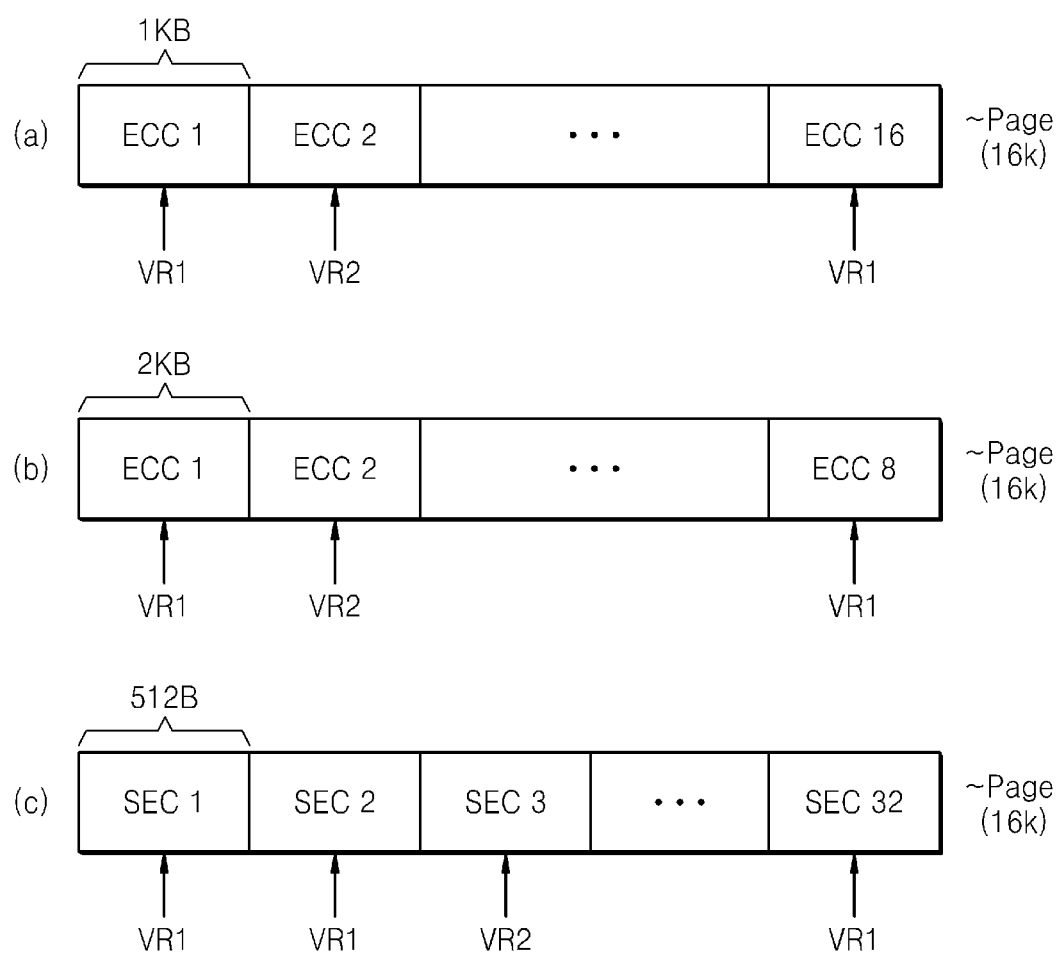
FIGS. 8A to 8C illustrate various examples of a read voltage setting operation illustrated in FIG. 7.

FIGS. 8A to 8C illustrate various examples of a read voltage setting operation of FIG. 7. As illustrated in FIG. 8A, one page may be partitioned by multiple ECC units. For example, where one page has a size of 16 k bytes and the ECC unit has a size of 1 k bytes, one page may include sixteen ECC units. On the other hand, as illustrated in FIG. 8B, where the ECC unit has a size of 2 k bytes, one page comprises eight ECC units. Meanwhile, FIG. 8C illustrates an example where a read voltage level is set for each sector unit, and where one page has a size of 16 k bytes and a sector unit has a size of 512 bytes, one page comprises thirty-two sector units.

According to the embodiment of FIG. 7, the read voltage level is set for each ECC unit (or for each sector unit). FIG. 8A illustrates an example where a first level read voltage VR1 is set with respect to first and sixteenth ECC units ECC1 and ECC16 and a second level read voltage VR2 is set with respect to a second ECC unit ECC2. Although not illustrated in the drawings, first level read voltage VR1, second level read voltage VR2, or a read voltage of a different level may be set with respect to other ECC units.

Meanwhile, FIG. 8B illustrates an example where first level read voltage VR1 is set with respect to first ECC unit ECC1 and an eighth ECC unit ECC8 and second level read voltage VR2 is set with respect to second ECC unit ECC2. In FIG. 8B, first level read voltage VR1, second level read voltage VR2, or a read voltage of a different level may be set with respect to other ECC units.

Meanwhile, FIG. 8C illustrates an example where a read voltage is set for each sector unit, where a sector unit is a read/program unit of data recognized by an external host. In other words, where an error detection/correction operation is performed with respect read data, the error detection/correction operation may be performed on every units of data of two or more sectors. Where errors are detected, a re-read operation may be performed for each sector unit, and read voltages of different levels may be set for each sector unit in order to reduce the possibility of generating errors.

FIG. 8C illustrates an example where first level read voltage VR1 is set with respect to first, second, and thirty-two ECC units SEC1, SEC2, and SEC32 and second level read voltage VR2 set with respect to second ECC unit SEC2. In FIG. 8C, first level read voltage VR1, second level read voltage VR2, or a read voltage of a different level may be set with respect to other SEC units.

Figure 9:
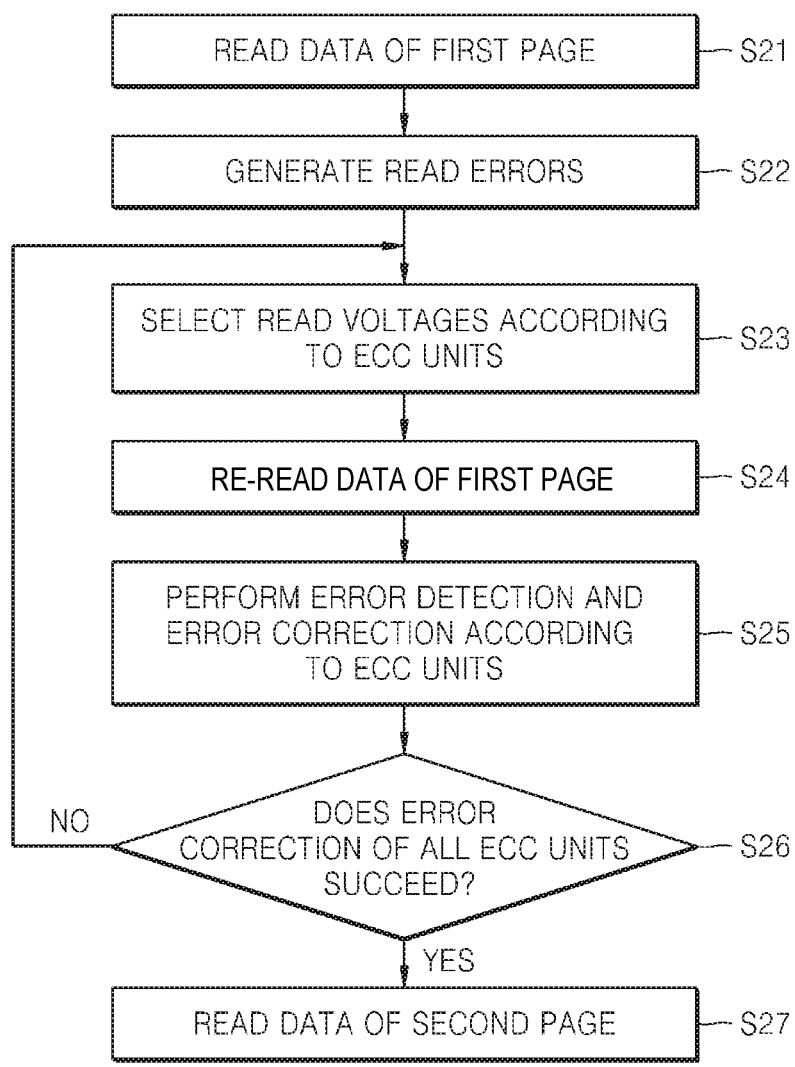
FIG. 9 is a flowchart illustrating a method of operating a memory system according to another embodiment of the inventive concept.

FIG. 9 is a flowchart illustrating a method of operating a memory system according to another embodiment of the inventive concept. In the example of FIG. 9, a re-read operation is performed for each area using read voltages of different levels, and it is assumed that the area corresponds to the ECC unit for error detection and correction operations. The memory cell array comprises multiple pages, and for convenience of description, a read retry operation for a first page from among the pages will be described.

Where a read operation for the first page is performed (S21), the error detection operation for the read data is performed, and at least a part of data stored in the first page has a value that has varied due to, for example, a variation in threshold voltage, a read error occurs (S22). In response to detection of a read error, an algorithm for recovering this is performed. For example, a read retry operation may be performed.

Read voltage level information is stored in the memory system, and a read voltage is selected for each ECC unit with reference to the stored information (S23). In addition, data stored in the first page is re-read according to the read voltage of the selected level (S24), and error detection and correction operations are performed for each ECC unit on the re-read data (S25). For example, where errors occur in the first ECC unit, the read voltage of the first level is selected, and then error detection and correction operations are performed on the data of the first ECC unit which is re-read by the read voltage of the first level.

It is determined whether error correction for all the ECC units is successful (S26). Where at least one of the ECC units in the first page has errors, a read voltage selection operation and an error detection/correction operation are repeated for each ECC unit. For example, where the second ECC unit has errors, the read voltage of the second level corresponding to the second ECC unit is selected, and thus data of the second ECC unit is re-read, thereby not generating an error or generating only correctable errors in the second ECC unit. The errors are corrected by performing the above-described operation on all the ECC units in which errors have occurred.

Where error correction for all the ECC units in the first page succeeds, a read operation for the first page may be completed, and then a read operation for the second page may be performed. Where errors are detected in data of the second page, a series of operations, such as an operation of selecting a read voltage for each ECC unit and an error detection/correction operation for the re-read data, may be repeatedly performed.

In the embodiment of FIG. 9, because a read error occurs even during the read retry operation, the re-read operation may be prevented from being repeated multiple times. In particular, because a read voltage level at which occurrence of errors may be minimized is set for each ECC unit, only one re-read operation may be performed on each of the ECC units in a read retry section. Alternatively, even though a read error occurs with respect to multiple ECC units during a normal read operation, if the read voltages of the same level are set in two or more ECC units, data of the two or more ECC units may be read through one re-read operation using the same read voltage, thereby reducing a number of re-read operations.

Although not illustrated in FIG. 9, it is possible that errors may remain uncorrected in spite of the read retry operation, and a threshold value may be set with respect to a number of cycles of the read retry operation. After the read retry operation is performed by cycles corresponding to the threshold value, error correction may be tried with respect to data in which errors have not been corrected by using a different ECC processing method or data having errors may be output.

FIGS. 10 to 14 illustrate various examples of a read retry operation. In the embodiment of FIGS. 10 to 14, only one page is illustrated, and it is assumed that one page comprises sixteen ECC units. As described above, sector units may be used instead of the ECC units.

Figure 10:
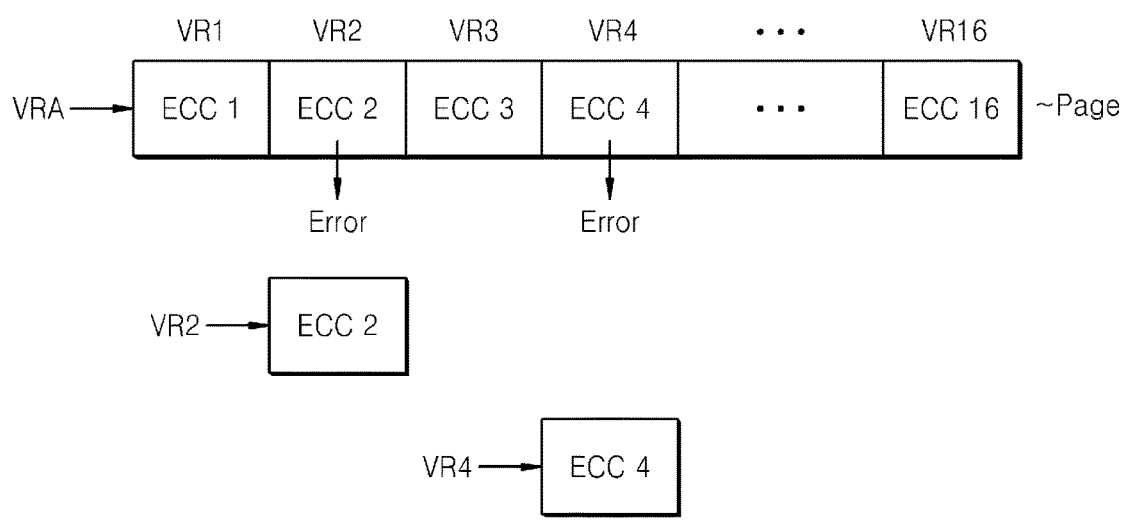
FIGS. 10 to 14 illustrate various examples of a read retry operation.

Referring to FIG. 10, a normal read operation for the page is performed using first read voltage VRA. An error detection/correction operation is performed on data of the read page. FIG. 10 illustrates an example in which errors or uncorrectable errors occur in data of second ECC unit ECC2 and fourth ECC unit ECC4.

Because errors have occurred in one or more ECC units, a read retry section may be performed. In the read retry section, data is re-read with respect to second and fourth ECC units ECC2 and ECC4 in which errors have occurred, and an error detection/correction operation is performed on the re-read data. For this, first, second level read voltage VR2 is selected as a read voltage corresponding to second ECC unit ECC2, and data of second ECC unit ECC2 is re-read by using second level read voltage VR2. An error may not occur or correctable errors may occur in the re-read data of second ECC unit ECC2.

Similarly, a fourth level read voltage VR4 is selected as a read voltage corresponding to fourth ECC unit ECC4, and data of fourth ECC unit ECC4 is re-read by using fourth level read voltage VR4. An error may not occur or correctable errors may occur in the re-read data of fourth ECC unit ECC4.

In the embodiment of FIG. 10, where a read voltage of any one level is applied, data of all the ECC units connected to the same word line may be simultaneously read. However, the read data may be stored in the page buffer, and only data of second ECC unit or fourth ECC unit may be output from among the data stored in the page buffer so as to perform the above-described error detection/correction operation.

FIGS. 11 to 14 illustrate various examples of a re-read operation that may be performed in the read retry section. For convenience of description, it is assumed that one page includes sixteen ECC units and all sixteen ECC units are objects to be re-read.

Figure 11:
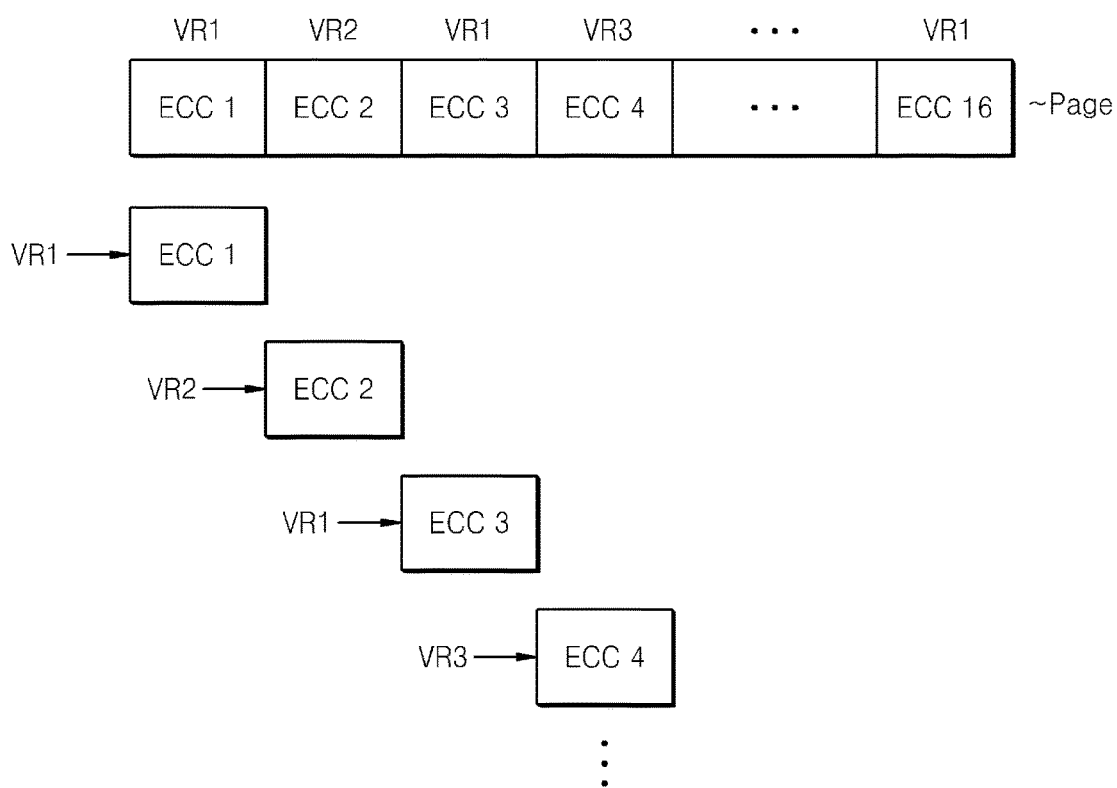

Referring to FIG. 11, in an example of the read retry operation, the level of a read voltage is selected for each ECC unit to perform the read operation. First level read voltage VR1 for reading first ECC unit ECC1 is selected with reference to the read voltage level information stored in the memory system, and data of the page is read by first level read voltage VR1 so as to store data of ECC units ECC1 to ECC16. Because the level of the read voltage causing an error not to occur or a minimum amount of errors to occur is previously set, an error may not occur or only correctable errors may occur in the data from first ECC unit ECC1.

Meanwhile, second level read voltage VR2 is selected to read the data of second ECC unit ECC2, and the data of ECC units ECC1 to ECC16 is stored in the page buffer by reading the data of the page by second level read voltage VR2. Among ECC units ECC1 to ECC16, an error detection/correction operation may be performed on the data from second ECC unit ECC2, and an error may not occur or only correctable errors may occur in the data from second ECC unit ECC2.

A read retry operation is performed on all ECC units ECC1 to ECC16 in the page according to the above-described operation. For example, a third level read voltage VR3 is selected to read data of fourth ECC unit ECC4, and a page read operation is performed using third level read voltage VR3. Although FIG. 11 illustrates an example in which an error detection/correction operation of the ECC unit is sequentially performed from first ECC unit ECC1 to sixteenth ECC unit ECC16, the inventive concept is not limited thereto, and the error detection/correction operation of the ECC unit may be performed in a different order or randomly.

Figure 12:
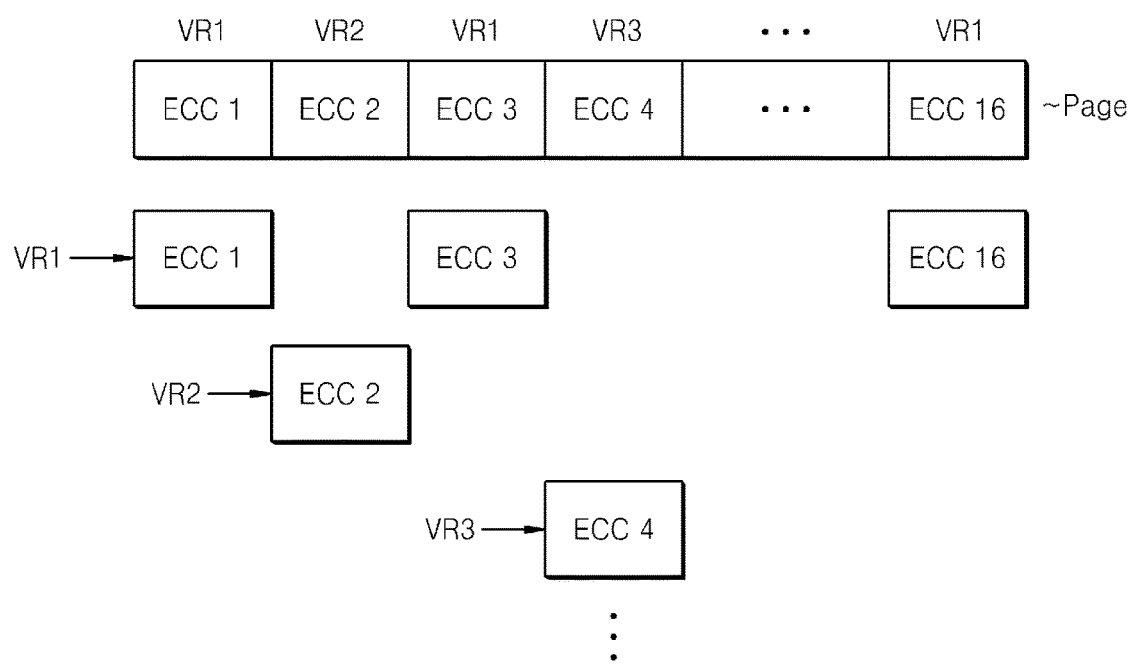

FIG. 12 illustrates another example of a read retry operation. For example, where it is assumed that an operation of performing an error detection/correction operation is performed by applying one read voltage during the read retry operation is one cycle, the error detection/correction operation is performed on data of at least two ECC units during one cycle.

Information regarding the ECC units in which first level read voltage VR1 is selected may be known with reference to the read voltage level information stored in the memory system. For example, as illustrated in FIG. 12, first level read voltage VR1 is selected with respect to at least first, third, and sixteenth ECC units ECC1, ECC3, and ECC16. Where the data of the page is read by first level read voltage VR1, the units of data of ECC units ECC1 to ECC16 are stored in the page buffer.

An error detection/correction operation is performed on the ECC units in which first level read voltage VR1 is selected. For example, an error may not occur or only correctable errors may occur in the data from the first, third, and sixteenth ECC units ECC1, ECC3, and ECC16.

Where the read retry operation using first level read voltage VR1 is completed, a read retry operation is performed using second level read voltage VR2. Second level read voltage VR2 may be selected with respect to other ECC units comprising second ECC unit ECC2, and an error detection/correction operation is performed on the ECC units corresponding to second level read voltage VR2. For example, an error may not occur or only correctable errors may occur in the data from second ECC unit ECC2.

Where the read retry operation using second level read voltage VR2 is completed, a read retry operation is performed using third level read voltage VR3. Third level read voltage VR3 may be selected with respect to other ECC units comprising fourth ECC unit ECC4, and an error detection/correction operation is performed on the ECC units corresponding to third level read voltage VR3. For example, an error may not occur or only correctable errors may occur in the data from fourth ECC unit ECC4.

According to the above-described embodiment, the re-read operation using the read voltages having the same level may be prevented from being repeatedly performed, and thus the total time required to perform the read retry operation may be reduced.

Figure 13:
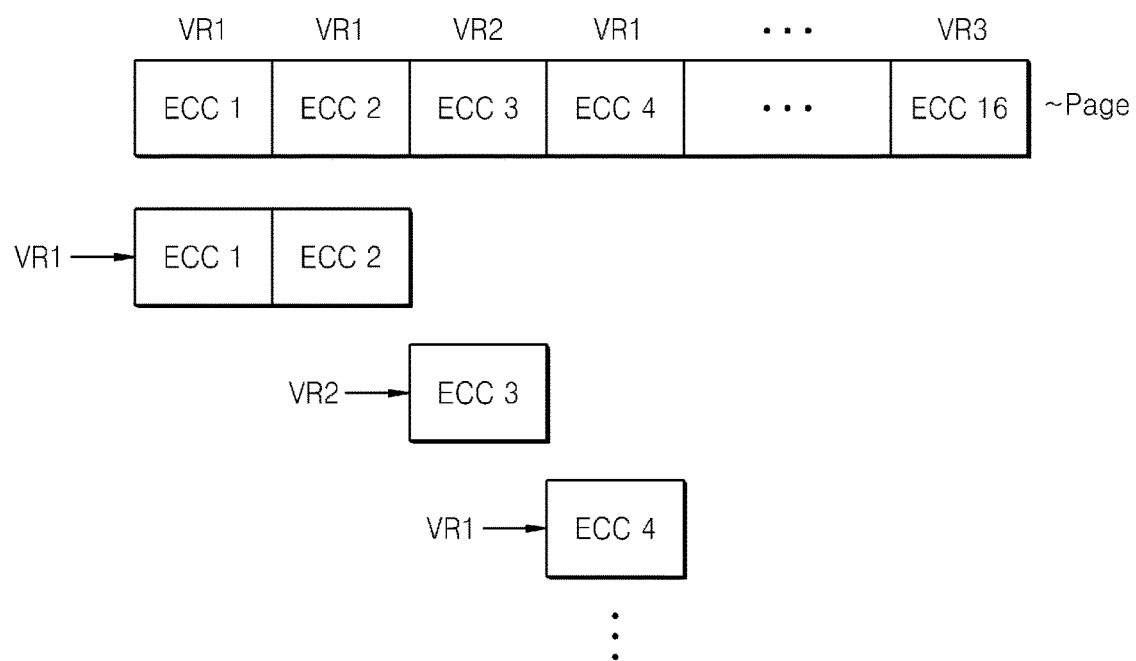

FIG. 13 illustrates another example of the read retry operation. For example, during the read retry operation, an error detection/correction operation is performed during one cycle on two or more continuous ECC units in which the read voltages having the same level are set. Regarding a threshold voltage distribution, the threshold voltage distributions of the ECC units adjacent to each other may vary in a similar way, and thus the read voltages having the same level may be set in the ECC units adjacent to each other. In the current embodiment, because the ECC units adjacent to each other in which the read voltages having the same level are set are re-read during one cycle, a number of cycles required for the read retry operation may be reduced.

Where first level read voltage VR1 is selected with respect to first and second ECC units ECC1 and ECC2, the data of the page is read by first level read voltage VR1, and an error detection/correction operation for the data from first and second ECC units ECC1 and ECC2 is performed. An error may not occur or only correctable errors may occur in the data from first and second ECC units ECC1 and ECC2.

Second level read voltage VR2 is selected with respect to following third ECC unit ECC3, and an error detection/correction operation for the data from third ECC unit ECC3 read by first level read voltage VR1 is performed. An error may not occur or only correctable errors may occur in the data from third ECC unit ECC3. Similarly, first level read voltage VR1 is selected with respect to fourth ECC unit ECC4, and an error detection/correction operation for the data from fourth ECC unit ECC4 read by first level read voltage VR1 is performed. A read voltage of a predetermined level is selected with respect to each ECC unit, and an error detection/correction operation is performed with respect to all the ECC units in one page. Where read voltages having the same level are set with respect to two or more continuous ECC units, an error detection/correction operation may be performed on the two or more ECC units by one read operation.

Figure 14:
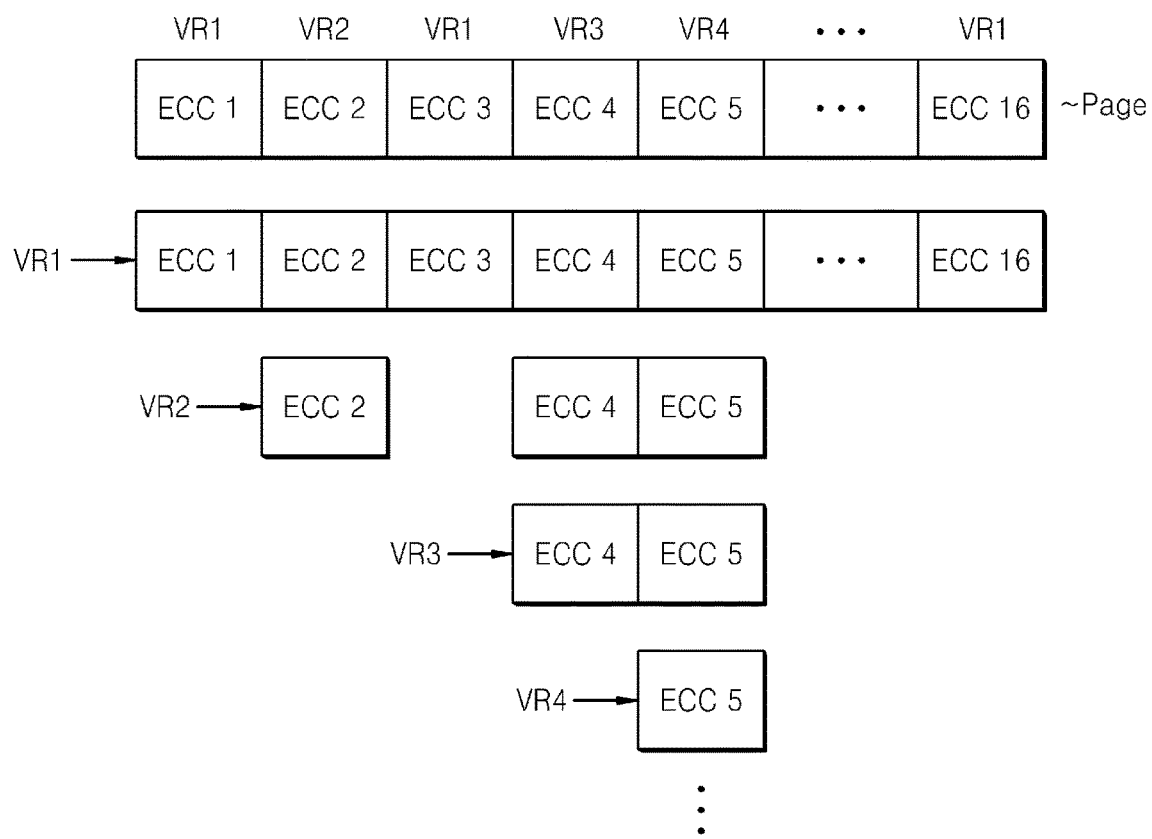

FIG. 14 illustrates another example of the read retry operation. For example, an error detection/correction operation is performed on all the ECC units in which errors are to be detected/corrected during one cycle. For example, where a difference in voltage level between the first level read voltage and the second level read voltage is not great, even though the second level read voltage is set with respect to the second ECC unit and data of the second ECC unit is read by using the first level read voltage, an error may not occur or correctable errors may occur in the data that is read from the second ECC unit.

Referring to FIG. 14, the data of the page is read by first level read voltage VR1, and an error detection/correction operation is performed on the data from first to sixteenth ECC units ECC1 to ECC16 in the page. An error may not occur or only correctable errors may occur in the data from one or more ECC units in which first level read voltage VR1 is set, for example, the first, third, and sixteenth ECC units ECC1, ECC3, and ECC16. Although an error may not occur in data from the ECC unit in which a read voltage of a different level is set, it is assumed for explanation purposes that an error does not occur only where data is read by the corresponding read voltage.

An error detection/correction operation of the read data is performed using a read voltage of a different level with respect to the ECC units in which errors have occurred (or the ECC units in which uncorrectable errors have occurred).

For example, the data of the page is read by second level read voltage VR2, and an error detection/correction operation may be performed on the ECC units in which errors have occurred. Thus, an error may not occur or only correctable errors may occur in the data from second ECC unit ECC2.

The above-described operation is repeatedly performed, and where the data of the page is read by third level read voltage VR3, an error may not occur or only correctable errors may occur in the data from fourth ECC unit ECC4. Where the data of the page is read by fourth level read voltage VR4, an error may not occur or only correctable errors may occur in the data from fifth ECC unit ECC5. Where the error detection/correction operations with respect to all the ECC units of the page are completed, error detection/correction operations with respect to the ECC units of the subsequent page are performed.

Figure 15:
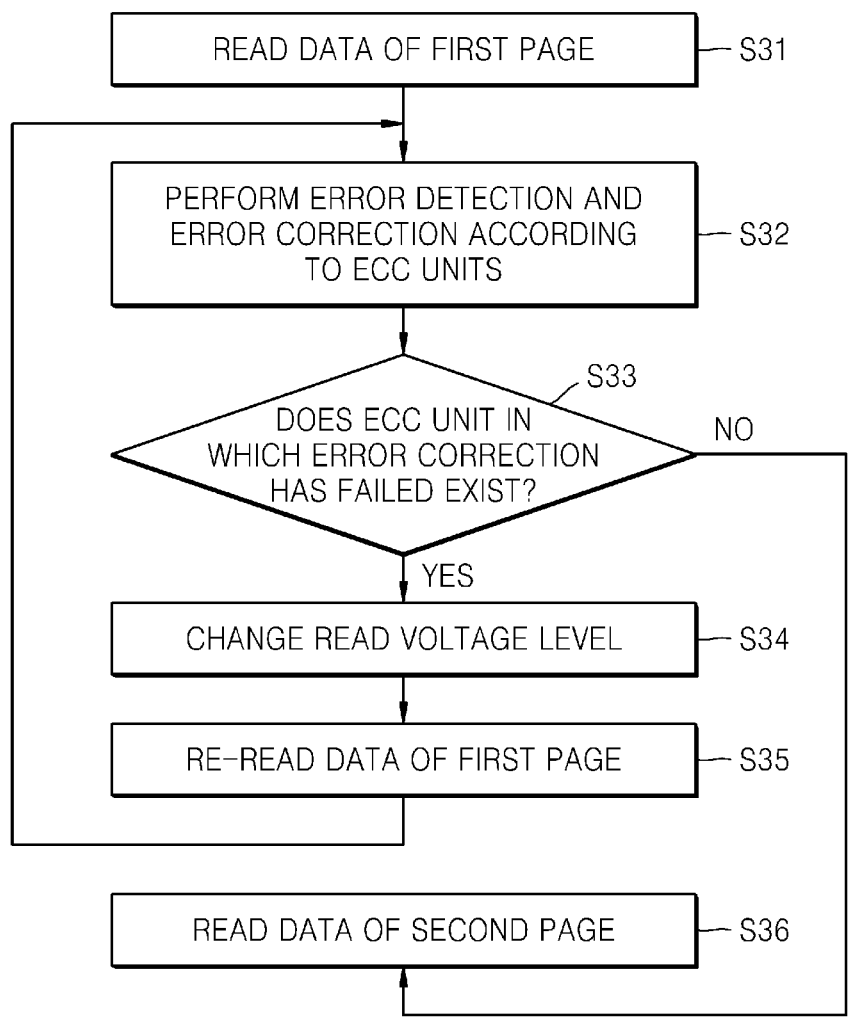
FIG. 15 is a flowchart illustrating a method of operating a memory system according to another embodiment of the inventive concept.

FIG. 15 is a flowchart illustrating a method of operating a memory system according to another embodiment of the inventive concept. FIG. 15 illustrates an example of operating the memory system according to the embodiment of FIG. 14.

In the method of FIG. 15, data of a first page is read by a predetermined read voltage (e.g., first read voltage) (S31), and a read operation using the first read voltage may be a normal read operation before a read retry operation. Error detection and correction operations are performed for each ECC unit on the ECC units in the first page (S32). On the basis of the error detection results of the data that is read by the normal read operation, it is determined whether or not the ECC unit in which errors occur or error correction has failed exists from among the ECC units of the first page (S33). As a result of the determination, if the ECC unit in which error correction has failed does not exist, an operation of reading data of a second page is performed (S36).

Where uncorrectable errors occur in at least one ECC unit, a read retry operation for re-reading data of the corresponding ECC unit is performed, and thus the level of the read voltage is changed (S34). The level of an optimal read voltage for each ECC unit is set in the memory system and the operation of changing the level of the read voltage may include an operation of selecting the level of the read voltage corresponding to the ECC unit in which uncorrectable error have occurred. Data of the first page is re-read by the level-changed read voltage (S35), and it is determined whether or not the ECC unit in which error detection/correction and error correction for the re-read data has failed exists. By repeatedly performing the above-described operation, an operation of reading data of the second page is performed where an error does not occur or error correction has succeeded with respect to all the ECC units in the first page (S36).

Figure 16:
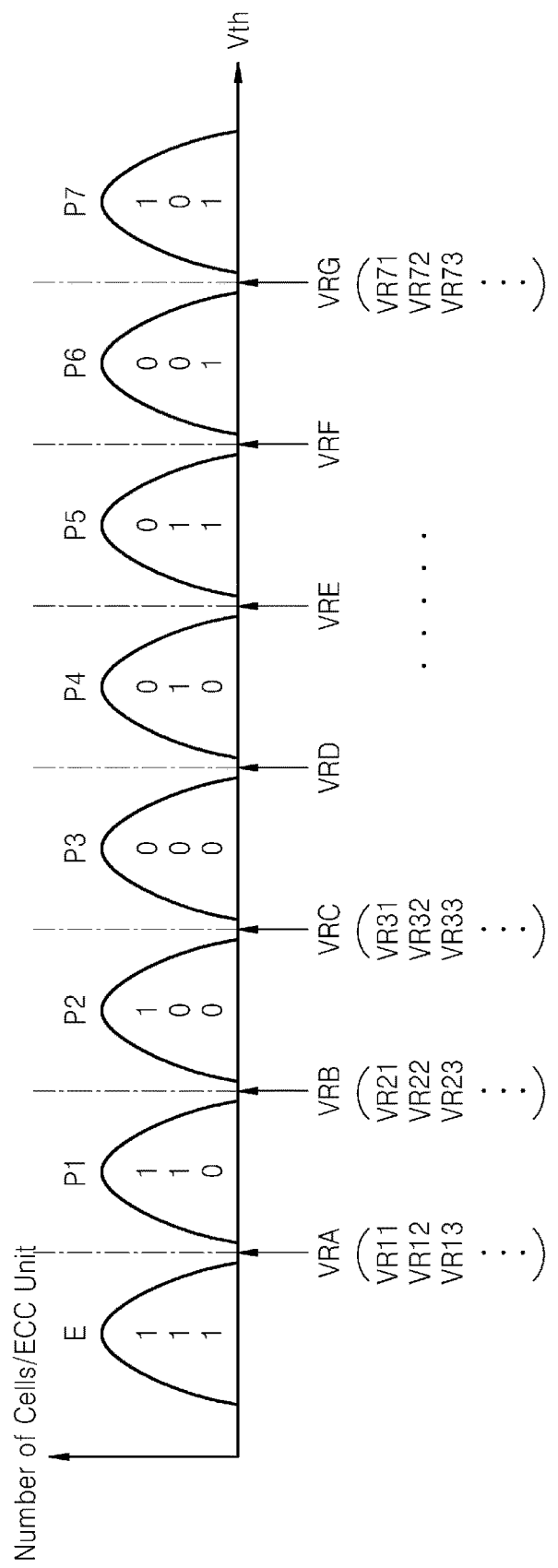
FIG. 16 is a diagram illustrating an example of setting the level of a read voltage for a read retry operation where a nonvolatile memory cell stores data of multiple bits.

FIG. 16 is a diagram illustrating an example of setting the level of a read voltage for a read retry operation where a nonvolatile memory cell stores data of multiple bits. For example, a triple level cell storing data of 3 bits for each cell is illustrated, and each of nonvolatile cells has eight threshold voltage distributions according to a programmed state. In addition, the first to seventh read voltages VRA to VRG are used to distinguish the eight threshold voltage distributions during a read operation.

The level of the read voltage may be set in each ECC unit with respect to the first to seventh read voltages VRA to VRG. For example, the read operation using any one read voltage from among the first to seventh read voltages VRA to VRG is performed according to data to be read, an error detection/correction operation is performed on the read data, and a read retry operation is performed using the read voltage that is set for each ECC unit where errors occurs.

Where the read operation is performed using first read voltage VRA, erase state E and first program state P1 are distinguished. An error detection/correction operation is performed on the data that is read using first read voltage VRA, an algorithm for a read retry operation is performed where errors have occurred, and the read retry operation is performed using a read voltage of the level that is set for each ECC unit. The threshold voltage distributions may differently vary according to the ECC units, and thus occurrence of errors may be minimized when using the read voltages of different levels according to the ECC units. During the read retry operation performed on the ECC units in any one page, read voltages VR11, VR12, VR13, ... of various levels for distinguishing erase state E and first program state P1 are set.

The setting of the levels of the read voltages may be performed to distinguish different program states. For example, read voltages VR21, VR22, VR23, ... of various levels for distinguishing first program state P1 and second program state P2 are set according to the ECC units. An error detection/correction operation is performed on data that is read using second read voltage VRB, and a read retry operation is performed using the read voltage that is set for each ECC unit where errors have occurred. Similarly, read voltages VR31, VR32, VR33, ... of various levels for distinguishing second program state P2 and third program state P3 may be set according to the ECC units, and read voltages VR71, VR72, VR73, ... of various levels for distinguishing sixth program state P6 and seventh program state P7 may be set according to the ECC units.

Figure 17A:
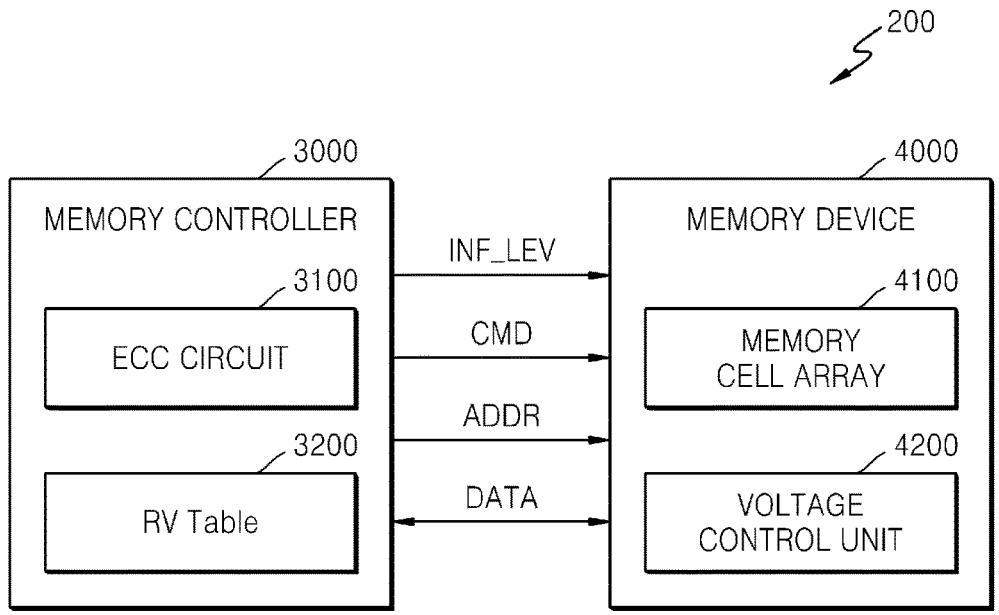
FIGS. 17A and 17B are block diagrams illustrating a memory system according to another embodiment of the inventive concept.
Figure 17B:
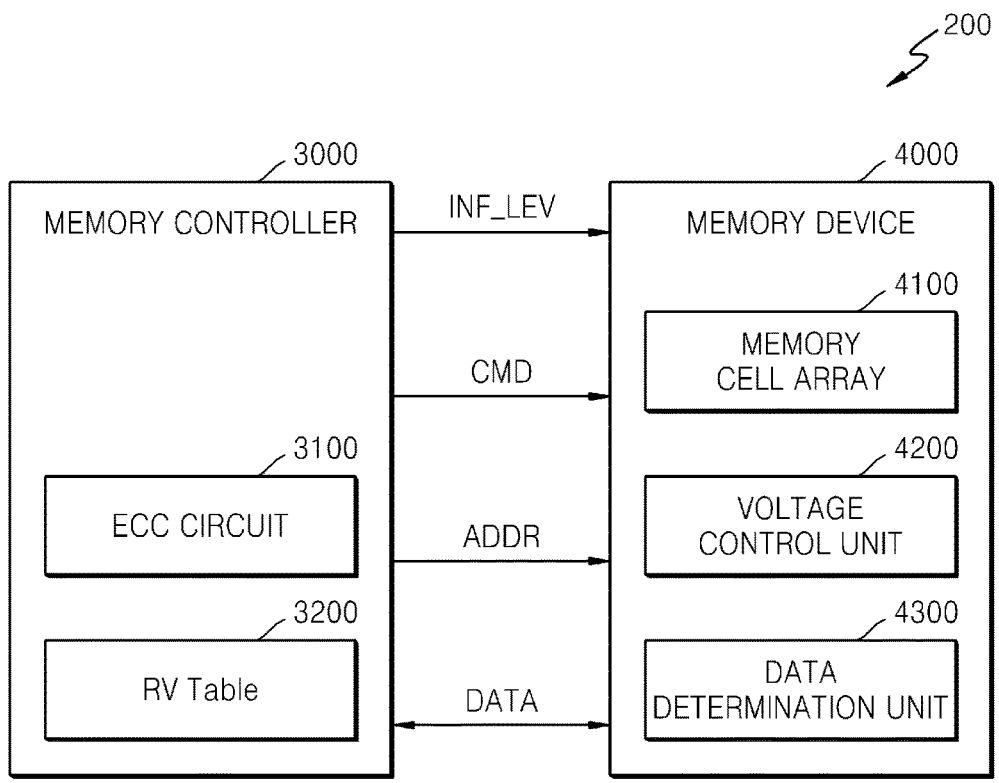

FIGS. 17A and 17B are block diagrams illustrating a memory system 200 according to another embodiment of the inventive concept.

Referring to FIG. 17A, memory system 200 comprises a memory controller 3000 and a memory device 4000. Some features of memory system 200 are substantially the same as those in memory system 100 of FIG. 1, and a description of those features may be omitted to avoid redundancy. Memory controller 3000 comprises an ECC circuit 3100 for performing an error detection/correction operation on data DATA received from memory device 4000 and a read voltage table 3200 for storing multiple units of read voltage level information that are set according to the ECC units. In addition, memory device 4000 comprises a memory cell array 4100 comprising a nonvolatile memory cell and a voltage control unit 4200 for controlling generation of a voltage signal used for a memory operation. Voltage control unit 4200 in memory device 4000 may perform substantially the same function as the voltage control unit in the memory controller of FIG. 1.

ECC circuit 3100 performs error detection/correction on data read from memory device 4000, and memory controller 3000 outputs level information INF_LEV associated with a read voltage level to be changed for each ECC unit according to the error detection/correction results. For example, memory controller 3000 outputs a read command and an address for the subsequent page where errors do not occur in the read data. On the other hand, where errors do not occur in the read data, an algorithm for performing a read retry operation is performed, and a signal according to the performing of the algorithm is provided to memory device 4000. Level information INF_LEV may be generated with reference to information stored in read voltage table 3200.

Where errors have occurred in at least some of the ECC units in a predetermined page, memory controller 3000 outputs command CMD and address ADDR for the read retry operation to the ECC units and outputs level information INF_LEV of the set read voltage to the ECC units. Voltage control unit 4200 generates a control signal for changing the level of the read voltage based on level information INF_LEV. A separate voltage generating unit (not shown) in memory device 4000 generates the level-changed read voltage based on the control signal. The read data by the level-changed read voltage is provided to memory controller 3000, and an error detection/correction operation for this and the operation of outputting level information INF_LEV according to the detection/correction operation are repeatedly performed.

Meanwhile, as another embodiment, as illustrated in FIG. 17B, memory device 4000 comprises memory cell array 4100 comprising a nonvolatile memory cell, voltage control unit 4200 for controlling generation of a voltage signal used for a memory operation, and a data determination unit 4300 for determining a value of data read from memory cell array 4100. In a similar way to the above-described configuration, memory controller 3000 comprises ECC circuit 3100 for performing an error detection/correction operation on data DATA and read voltage table 3200 for storing units of read voltage level information that are selected according to the ECC units.

An operation of determining the value of the data read from memory cell array 4100 may be performed by data determination unit 4300 in memory device 4000. For example, in order to set read voltage levels according to the ECC units, data determination unit 4300 determines a value 0 or a value 1 from the data read from each ECC unit and provides the determination results to memory controller 3000. Memory controller 3000 determines whether or not the level of the currently-used read voltage is a level that is optimized for the corresponding ECC unit. As a result of the determination, if an error does not occur in the corresponding ECC unit, the level of the currently-used read voltage is set as a read voltage level of the ECC unit, while if error occur in the ECC unit, memory controller 3000 controls data of the corresponding ECC unit to be read by the read voltage having a different level. The read voltage level information that is set for each ECC unit may be stored in read voltage table 3200.

Figure 18:
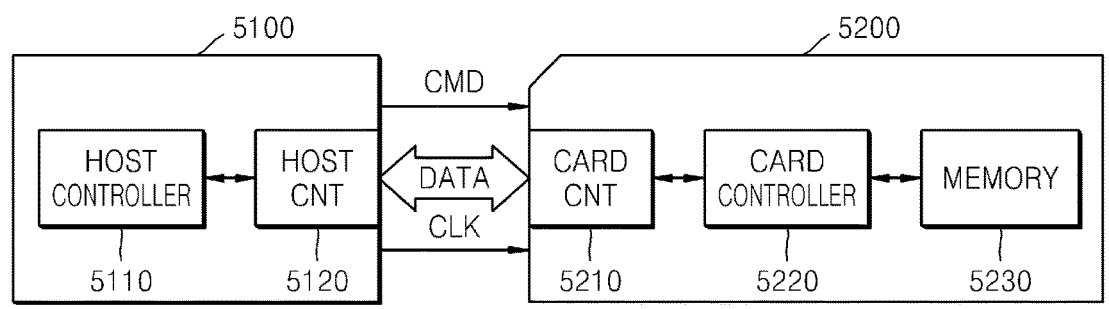
FIG. 18 is a block diagram of a memory card comprising a memory system according to an embodiment of the inventive concept.

FIG. 18 is a block diagram of a memory card comprising a memory system according to an embodiment of the inventive concept.

Referring to FIG. 18, a memory card system 5000 comprises a host 5100 and a memory card 5200. Host 5100 comprises a host controller 5110 and a host connection unit 5120. Memory card 5200 comprises a card connection unit 5210, a card controller 5220, and a memory device 5230.

Host 5100 may write data in memory card 5200 or may read data stored in memory card 5200. Host controller 5110 may send command CMD, a clock signal CLK generated by a clock generator (not shown), and data DATA to memory card 5200 via host connection unit 5120.

Card controller 5220 may store data in memory device 5230 in synchronization with the clock signal generated by the clock generator in card controller 5220 in response to the command received via card connection unit 5210. Memory device 5230 may store data sent from host 5100. Here, card controller 5220 or memory device 5230 comprises a voltage control unit for controlling the level of the read voltage described in the above-described embodiments.

Memory card 5200 may be configured as a compact flash card (CFC), a microdrive, a smart media card (SMC), a multimedia card (MMC), a security digital card (SDC), a memory stick, a universal serial bus (USB) flash memory driver, or the like.

Figure 19:
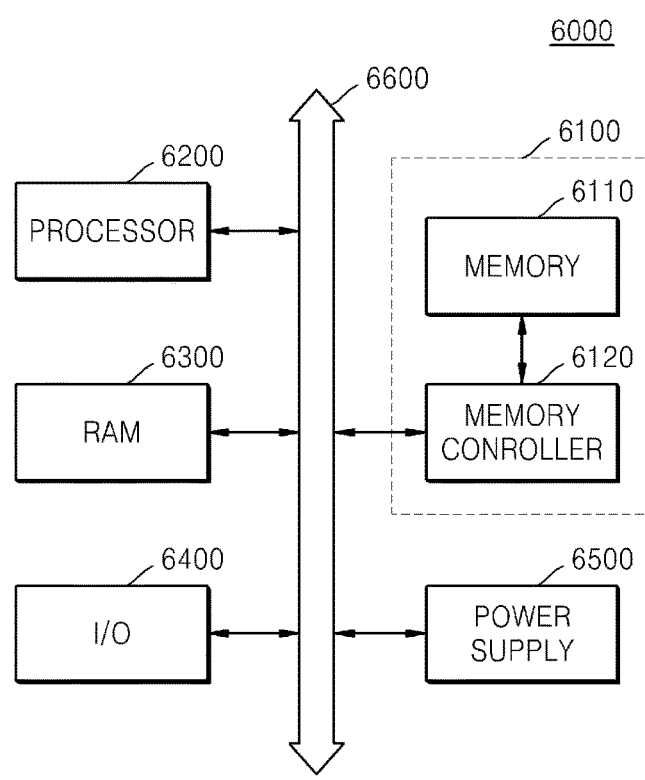
FIG. 19 is a block diagram of a computing system comprising a memory system according to an embodiment of the inventive concept.

FIG. 19 is a block diagram of a computing system 6000 comprising a memory system 6100 according to an embodiment of the inventive concept.

Referring to FIG. 19, computing system 6000 comprises memory system 6100, a processor 6200, a RAM 6300, an input/output device 6400, and a power supply 6500. Memory system 6100 includes memory 6110 and memory controller 6120 as shown. Although not illustrated in FIG. 19, computing system 6000 may further include multiple ports capable of communicating with a video card, a sound card, a memory card, a USB device, or the like or communicating with other electronic devices. Computing system 6000 may be configured as a portable electronic device such as a personal computer, a notebook computer, a mobile phone, a personal digital assistant (PDA), or a camera.

Processor 6200 may perform specific calculations or tasks. According to embodiments of the inventive concept, processor 6200 may be a micro-processor or a central processing unit (CPU). Processor 6200 may communicate with RAM 6300, input/output device 6400, and memory system 6100 via a bus 6600 such as an address bus, a control bus, or a data bus. In certain embodiments of the inventive concept, processor 6200 may also be connected to an expansion bus such as a peripheral component interconnect (PCI) bus.

RAM 6300 may store data necessary for an operation of computing system 6000. For example, RAM 6300 may be configured as a DRAM, a mobile DRAM, an SRAM, a PRAM, an FRAM, an RRAM, and/or an MRAM.

Input/output device 6400 may include an input unit such as a keyboard, a keypad, or a mouse and an output unit such as a printer or a display. Power supply 6500 may supply an operating voltage necessary for an operation of computing system 6000.

Figure 20:
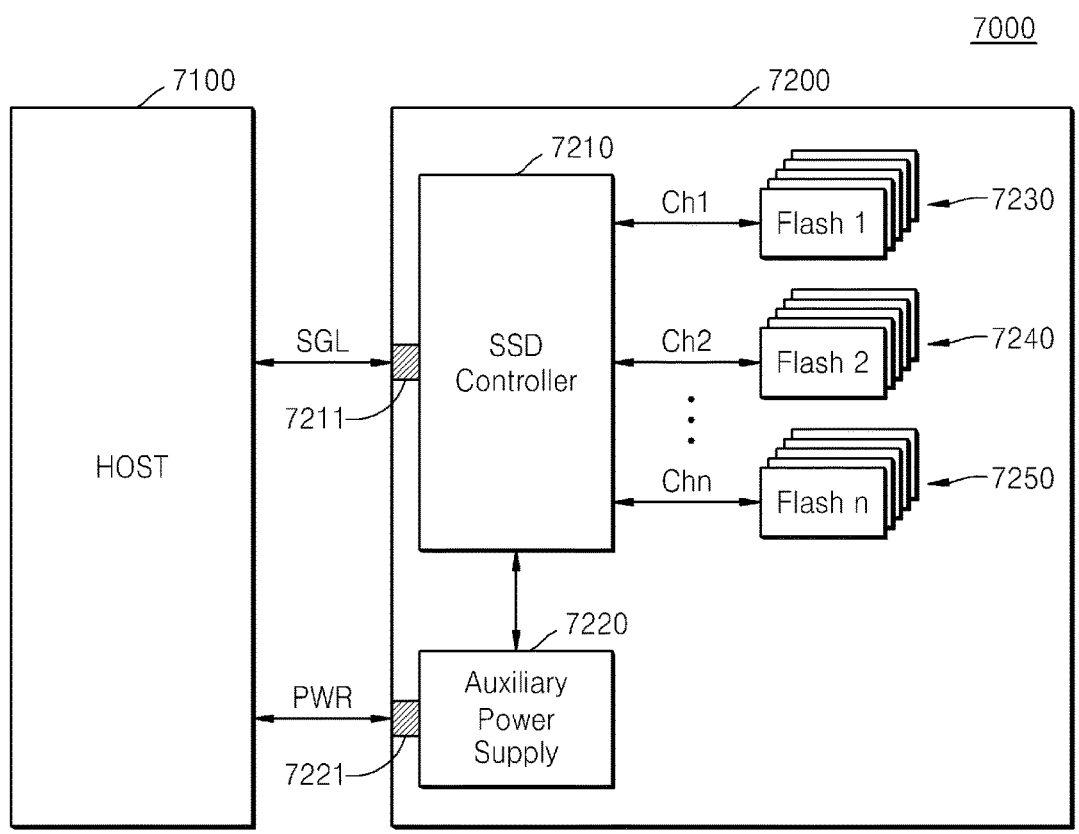
FIG. 20 is a block diagram of a solid state drive (SSD) comprising a memory system according to an embodiment of the inventive concept.

FIG. 20 is a block diagram of an example of using the memory system according to the embodiments of the inventive concept in a solid state drive (SSD) 7200.

Referring to FIG. 20, an SSD system 7000 comprises a host 7100 and SSD 7200. SSD 7200 exchanges a signal with host 7100 via a signal connector 7211 and receives power via a power connector 7221. SSD 7200 comprises an SSD controller 7210, an auxiliary power supply 7220, and multiple memory devices 7230, 7240, and 7250. Here, SSD controller 7210 or memory devices 7230, 7240, and 7250 comprises a voltage control unit for controlling the level of the read voltage according to the above-described embodiments.

Figure 21:
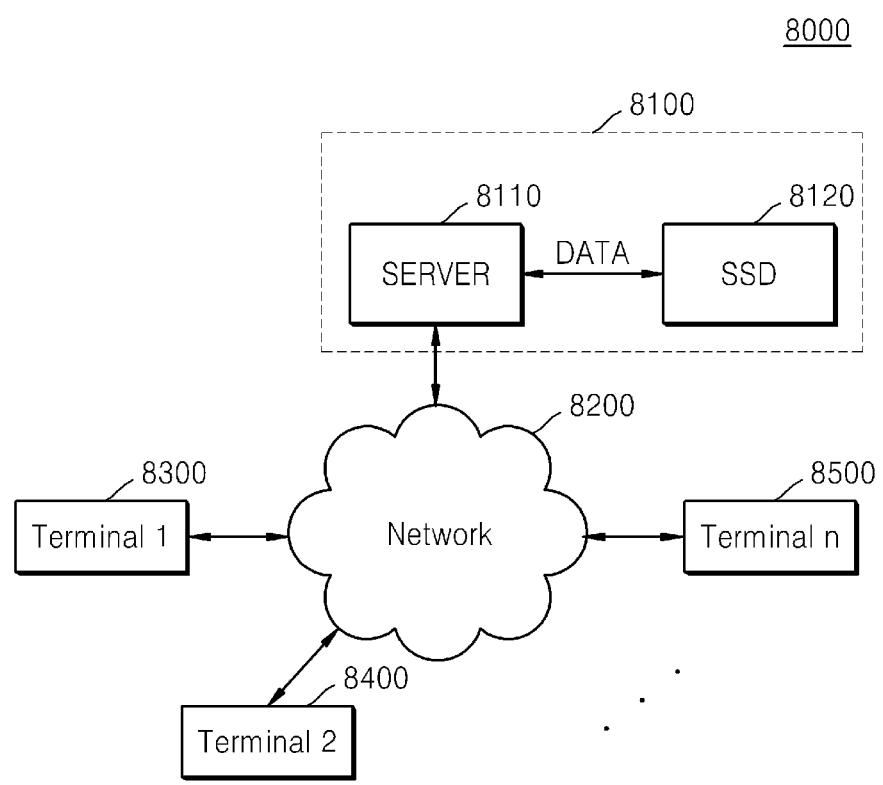
FIG. 21 is a block diagram of a server system and a network system comprising the SSD of FIG. 20.

FIG. 21 is a block diagram of a server system 8100 and a network system 8000 comprising an SSD such as SSD 7200 of FIG. 20.

Referring to FIG. 21, network system 8000 comprises server system 8100 and multiple terminals 8300, 8400, and 8500 that are connected to each other via a network 8200. Server system 8100 comprises a server 8110 that processes a request received from terminals 8300, 8400, and 8500 connected to network 8200 and an SSD 8120 storing data corresponding to the request received from terminals 8300, 8400, and 8500. Here, SSD 8120 may be SSD 7200 of FIG. 20.

Meanwhile, various devices and systems described above may be mounted using any of various types of packages. For example, a memory system may be mounted using a package such as Package on Package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric-quad flat pack (MQFP), a small outline (SOIC), a shrink small outline package (SSOP), a thin small outline (TSOP), a thin quad flatpack (TQFP), a system in package (SIP), a multi chip package (MCP), a wafer-level fabricated package (WFP), a wafer-level processed stack package (WSP), or the like.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A nonvolatile memory device, comprising:
    a memory cell array comprising a selected page comprising multiple error correction code (ECC) units; and
    a voltage generation unit configured to generate read voltages to read data from the selected page,
    wherein read voltage levels of the read voltages are set individually for the respective ECC units according to data detection results for each of the ECC units upon powering up of the nonvolatile memory device,
    wherein during a read retry section performed with respect to selected ECC units of the selected page for which read errors have been detected, a re-read operation of the selected ECC units is performed according to the respective read voltage levels set for the selected ECC units, and
    wherein one read retry section for one page includes a plurality of cycles, a read voltage from among the read voltages having a different level is selected in each of the plurality of cycles.

2. The nonvolatile memory device of claim 1, wherein the read voltage levels corresponding to the respective ECC units are set on the basis of threshold voltage distributions of the respective ECC units of the memory cell array.

3. The nonvolatile memory device of claim 1, further comprising:
    a controller configured to control information related to the read voltage levels corresponding to the respective ECC units to be stored and further configured to control data to be read according to the read voltage levels set with respect to the respective ECC units in the read retry section.

4. The nonvolatile memory device of claim 3, wherein the controller comprises:
    an error correction circuit configured to perform error detection/correction on the data of the ECC units; and
    a voltage control unit configured to generate a control signal for controlling the read voltage levels with reference to the error detection/correction results and the information related to the read voltage levels.

5. The nonvolatile memory device of claim 1, wherein the read retry section is performed where an uncorrectable error is detected in data read from at least one ECC unit of the selected page.

6. The nonvolatile memory device of claim 1, wherein the memory cell array comprises multiple NAND flash memory cells.

7. The nonvolatile memory device of claim 1, wherein in the read retry section, only one re-read operation is performed on the selected ECC units using the set read voltage levels.

8. The nonvolatile memory device of claim 1, wherein a read operation for the selected page is performed using a normal read voltage during a read operation, and first and second ECC units in which read errors have occurred are re-read according to the read voltage levels that are set to be different from each other.

9. A method of operating a nonvolatile memory device, comprising:
    setting read voltage levels corresponding to multiple error correction code (ECC) units based on data detection results for the respective ECC units;
    performing error detection on data read from first to n-th ECC units (n>1) from among the ECC units connected to a same word line using a normal read voltage;
    according to the error detection results, selecting read voltage levels corresponding to the respective ECC units with respect to one or more of the ECC units connected to the same word line in which read errors have occurred; and
    re-reading data for the ECC units using the read voltage levels selected with respect to the respective ECC units,
    wherein units of information related to the read voltage levels that are set to correspond to the respective ECC units are stored in the nonvolatile memory device, and
    wherein where a same read voltage level from among the set read voltage levels is set in the ECC units in which the read errors have occurred, all units of data of the ECC units in which the read errors have occurred are re-read through one re-read operation.

10. The method of claim 9, wherein the units of information related to the read voltage levels are stored in a table in the nonvolatile memory device, and where read errors occur in one or more ECC units, the read voltage levels corresponding to the respective ECC units are selected using the information stored in the table in the nonvolatile memory device.

11. The method of claim 9, wherein where read errors occur in first and second ECC units according to read results using the normal read voltage, the first and second ECC units are re-read according to the read voltage levels that are set to be different from each other.

12. The method of claim 9, wherein the setting of the read voltage levels is performed upon powering up of the nonvolatile memory device.

13. The method of claim 12, wherein the read voltage levels are set to reduce errors in the respective ECC units.

14. The method of claim 9, wherein in the re-reading of data, only one re-read operation is performed in each of the ECC units in which a read error has occurred.

15. The method of claim 9, wherein where m-different read voltage levels from among the set read voltage levels are set in the ECC units in which the read errors have occurred, all units of data of the ECC units in which the read errors have occurred are re-read through m re-read operations (m>1).

16. A memory system, comprising:
    a memory controller comprising a voltage control unit and an error correction code (ECC) circuit; and
    a nonvolatile memory device comprising a memory cell array comprising a selected page comprising multiple ECC units and a voltage generation unit configured to generate read voltages to read data from the selected page,
    wherein the memory controller is configured to control the nonvolatile memory device to detect data stored in each of the respective ECC units upon powering up of the memory system, to set read voltage levels of the read voltages individually for the respective ECC units according to the detected data, and to control the nonvolatile memory device during a read retry section performed with respect to selected ECC units of the selected page for which read errors have been detected, such that a re-read operation of the selected ECC units is performed according to the respective read voltage levels set for the selected ECC units.

17. The memory system of claim 16, wherein the read voltage levels are determined by a search procedure configured to identify a valley between adjacent threshold voltage distributions associated with the respective ECC units.

18. The memory system of claim 16, wherein the nonvolatile memory device comprises a NAND flash memory device.

19. The memory system of claim 16, wherein the memory controller comprises a firmware unit configured to store a read voltage table containing the read voltage levels.

20. The memory system of claim 16, wherein the read voltage levels are set to reduce errors in the respective ECC units.

* * * * *